United States Patent [19]
Wojnarowski et al.

[11] Patent Number: 5,366,906
[45] Date of Patent: Nov. 22, 1994

[54] WAFER LEVEL INTEGRATION AND TESTING

[75] Inventors: Robert J. Wojnarowski, Ballston Lake; Constantine A. Neugebauer; Wolfgang Daum, both of Schenectady; Bernard Gorowitz, Clifton Park; Eric J. Wildi, Niskayuna; Michael Gdula, Knox; Stanton E. Weaver, Jr., Northville; Anthony A. Immorlica, Jr., Manlius, all of N.Y.

[73] Assignee: Martin Marietta Corporation, Philadelphia, Pa.

[21] Appl. No.: 962,000

[22] Filed: Oct. 16, 1992

[51] Int. Cl.[5] .................. H01L 21/66; G01R 31/26
[52] U.S. Cl. ........................................ 437/8; 437/51
[58] Field of Search ................. 437/8, 51; 324/158 R

[56] References Cited

U.S. PATENT DOCUMENTS

| | | | |
|---|---|---|---|
| 3,835,530 | 9/1974 | Killy | 437/8 |
| 4,288,911 | 9/1981 | Ports | 437/8 |
| 4,309,811 | 1/1982 | Calhoun | 437/8 |
| 4,703,436 | 10/1987 | Varshney | 364/490 |
| 4,783,695 | 11/1988 | Eichelberger et al. | 357/65 |
| 4,835,704 | 5/1989 | Eichelberger et al. | 364/490 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,907,062 | 3/1990 | Eichelberger et al. | 375/75 |
| 4,924,589 | 5/1990 | Leedy | 437/8 |
| 4,933,042 | 6/1990 | Eichelberger et al. | 156/239 |
| 5,019,946 | 5/1991 | Eichelberger et al. | 361/414 |
| 5,103,557 | 4/1992 | Leedy | 437/8 |
| 5,166,605 | 11/1992 | Daum et al. | 324/158 |

OTHER PUBLICATIONS

"Bare Chip Test Techniques for Multichip Modules" by R. A. Fillion, et al, GE Corporate Research and Development Center, Schenectady, N.Y.
"Status and Update on the GE HDI Multichip Module Technology" by R. A. Fillion, et al, GE Corporate Research and Development Center, Schenectady, N.Y.

Primary Examiner—Tom Thomas
Attorney, Agent, or Firm—Geoffrey H. Krauss; Brian J. Rees

[57] ABSTRACT

In fabricating wafer scale integrated interconnects, a temporary or permanent dielectric layer and a pattern of electrical conductors are used to provide wafer scale integration or testing and burn-in. A resist can be used to cover the areas of IC pads on the wafer while the remainder of the pattern of electrical conductors is removed to provide for repair of the wafer scale integration structure. The pattern of electrical conductors may be configured so that the conductor lengths between at least some sub-circuits on a plurality of wafers are substantially electrically equal for signal propagation purposes; an additional wafer may be laminated to the wafer using an adhesive; controlled curfs may be cut into the wafer; and the wafer may be interconnected to an interface ring.

13 Claims, 21 Drawing Sheets

WAFER LEVEL INTEGRATION AND TESTING

CROSS-REFERENCE TO RELATED APPLICATIONS

This application is related to the following co-pending applications which are commonly assisted and are incorporated herein by reference:

W. M. Marcinkiewicz et al., "Integrated Circuit Chip Placement in a High Density Interconnect Structure", U.S. patent Ser. No. 07/962,449, (attorney's docket number RD-21,523), filed concurrently herewith;

R. J. Wojnarowski, "Thinning of Itegrated Circuit Chips for Lightweight Packaged Electronic Systems and Systems Resulting Therefrom", U.S. patent Ser. No. 07/962,379, (attorney's docket number RD-21,358), filed concurrently herewith.

BACKGROUND OF THE INVENTION

1. Field of the Invention

This invention is generally directed to enhanced wafer level integrated interconnects and testing. More particularly, the invention relates to testing and packaging a fabricated wafer through a removable dielectric layer overlying chip pads on the wafer and a pattern of electrical conductors.

2. Description of the Related Art

Multi-chip modules (MCMs) and certain assemblies of single chips which are difficult to package require the availability of unpackaged integrated circuits (ICs) with a very high yield because the overall module yield is proportional to the average component yield raised to the power of components in the MCM and the MCM fabrication yield. Currently, few, if any, unpackaged ICs are commercially available that are fully tested and burned in at the wafer level or after dicing. Though ICs are tested at the wafer level, this test is usually conducted at reduced speed using a limited test set. Typically, infant mortality (i.e., failure of newly-fabricated chips) cannot be eliminated due to the lack of burn-in fixturing. An additional problem occurs when ICs are contacted using probe-cards, since the cards may cause damage to the IC pads which may render them unusable in an MCM assembly.

Interconnection is a key to the success of wafer scale integration, but as wafer size gets increasingly larger, the run lengths required to accomplish a final interconnect get very long and very resistive. This greatly reduces the speed of the IC processed, devaluing the whole wafer scale integration premise. Wafer scale integrated circuits generally incorporate redundancy in order to improve yields, and current art uses switches to select the desired sub-circuits. These switches occupy valuable space and create switch losses and a lack of uniformity of conductor path length between sub-circuits among different wafers, which causes variations in phase among circuits.

Thermal stress in wafers requires a very near temperature coefficient of expansion match to the mounting surface. Materials such as silicon packages are possible but are costly and not mechanically strong. Other materials can be used, but the fact that many pin outs are needed for a wafer scale integration design limits the options. The integration of components using different base materials, e.g., GaAs, Ge, InSb, etc., is desirable for radio frequency (RF) operation, but is difficult with generic silicon processing.

The added weight of three-dimensional HDI (high density interconnect) modules with individual substrates attached to each module is another problem. In the aforementioned U.S. patent Ser. No. 07/962,379, thinned stacks of HDI circuits have their substrates ground off or otherwise removed. This allows stacking of thinned layers to form a multi-level thin three-dimensional assembly that has minimal weight and volume. If the assembly is not thinned, the ability to place vias through the assembly at random is greatly limited, due to the normal thickness of the chips requiring an assembly with via holes greater than 20 mils deep. The use of unmodified ICs in a unique interchangeable layer three-dimensional HDI format is desirable.

SUMMARY OF THE INVENTION

Accordingly, an object of the invention is to provide a method of testing an IC on a wafer that makes fully tested and burned-in unpackaged ICs available without damaging the primary IC pads, thus eliminating need for IC pretest and incoming electrical inspection.

Another object of the invention is to provide a method for conserving space in MCMs and establishing substantial phase uniformity among various components.

A further object of the invention is to provide a simple method of repair and rework for wafer scale integration technology.

Another object of the invention is to provide a biased ply structure to prevent breakage of normal wafers in an MCM.

Yet another object of the invention is to provide a stress relief method for mounting large wafers on materials that need not be exactly thermally matched to the package or mounting surface.

Still another object of the invention is to provide a method of assembling and mounting ICs at wafer scale integration onto irregular surfaces.

Another object of the invention is to provide a method of assembling multi-chip modules with improved three-dimensional stacking capability.

Briefly, in accordance with one embodiment of the invention, a method for fabricating a novel enhanced wafer level integration package comprises applying a dielectric layer to a wafer containing a plurality of chips with pads. The dielectric layer includes material selected from the group consisting of Kapton polyimide (Kapton is a trademark of E. I. dupont de Nemours and Co.), photosensitive polyimide, photoimageable organic dielectric layers, fully imidized polyimides, polyetherimides, benzocyclobutene, Teflon polytetrafluoroethylene, polymethyl-methacrylate, and like materials. A plurality of conductive vias is provided in the dielectric layer. The vias are aligned with at least some pre-designated pads. A predetermined pattern of electrical conductors on the dielectric layer is provided so that the conductors extend between the vias and thereby electrically connect selected pads in a circuit. The pattern of electrical conductors may be configured so that the conductor lengths between at least some sub-circuits on the same or different wafers are substantially equal, in order to provide substantial phase uniformity. Also, if desired, an additional wafer may thereafter be laminated to the wafer using an adhesive. Controlled curfs may also be cut into the wafer to enable mounting on surfaces which may not be fiat or may not have material which thermally matches the wafer material.

In accordance with another embodiment, a method for integrating circuit chips with an interface ring to form a novel package comprises positioning in a carrier an interface ring comprising an insulator and at least one electrical conductor, and positioning at least one chip inside the interface ring. A dielectric layer is applied to the at least one chip and the interface ring. A plurality of conductive vias is provided in the dielectric layer. The vias are aligned with at least some predesignated pads and with at least one electrical conductor of the interface ring. A predetermined pattern of electrical conductors is provided on the dielectric layer so that the conductors extend between the vias and thereby electrically connect the chip pads to at least one electrical conductor of the interface ring.

In accordance with another embodiment, a method for testing enhanced wafer level integration interconnects comprises applying a dielectric layer to a wafer containing a plurality of chips with pads. A plurality of vias is then provided in the dielectric layer. The vias are aligned with at least some predesignated pads. A predetermined testing pattern of electrical conductors and overlay test pads is provided on the dielectric layer. The testing pattern is completed by contacting the chip pads through the overlay test pads.

In accordance with another embodiment, a method for enhanced wafer level integration comprises testing a water containing a plurality of chips to identify good sub-circuits. At least some sub-circuits are then coupled with a predetermined pattern of electrical conductors so that the conductor lengths between sub-circuits on the same or different wafers are substantially equal, in order to provide substantial phase uniformity.

In accordance with another embodiment, a method for repairing an overlay interconnect structure having a dielectric layer containing vias and a pattern of electrical conductors comprises covering the surface of the interconnect structure with a resist and then exposing and developing the resist so as to leave resist in the via holes. The pattern of electrical conductors other than the areas of the vias is then etched, and the resist is removed. A desired pattern of electrical conductors is then provided on the dielectric layer.

In accordance with another embodiment, an enhanced wafer level testing package comprises a dielectric layer having a plurality of vias therein, overlying a wafer containing a plurality of chips with pads. The vias are aligned with at least some of the pads. Electrical conductors disposed on the dielectric layer extend between the vias so as to provide electrical connection between at least some predesignated pads through the vias in a circuit, The electrical conductors are configured so that a plurality of boundary scan signals, a power bus, and a ground bus of each chip are routed to a boundary of the wafer and the remaining inputs and outputs of individual integrated circuits are connected in pairs. Alternatively, the electrical conductors are configured so that a plurality of boundary scan signals of each chip is routed to a boundary of the wafer, the remaining inputs and outputs of individual integrated circuits are connected in pairs, and a plurality of power buses and a plurality of ground buses are routed to a common power bus and a common ground bus.

DESCRIPTION OF THE FIGURES

The features of the invention believed to be novel are set forth with particularity in the appended claims. The invention itself, however, both as to organization and method of operation, together with further objects and advantages thereof, may best be understood by reference to the following description taken in conjunction with the accompanying drawings, with like numerals throughout the drawings representing like components throughout the drawings, in which:

DETAILED DESCRIPTION OF THE INVENTION

Figure 1:
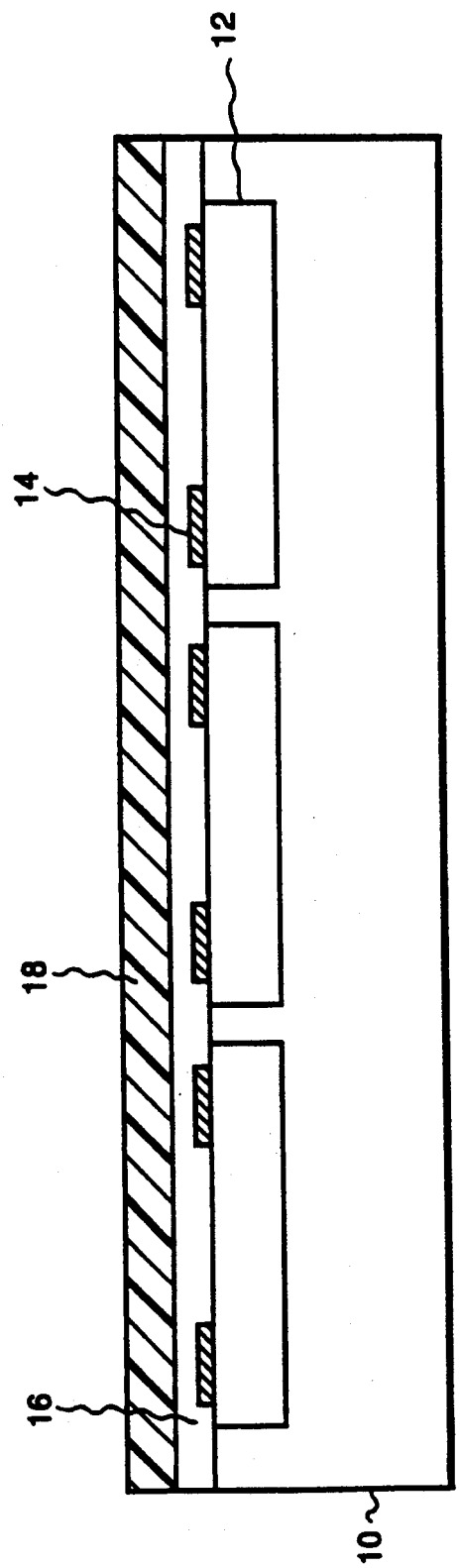
FIG. 1 is a cross-sectional side view illustrating a dielectric layer overlying a fabricated wafer.
Figure 2:
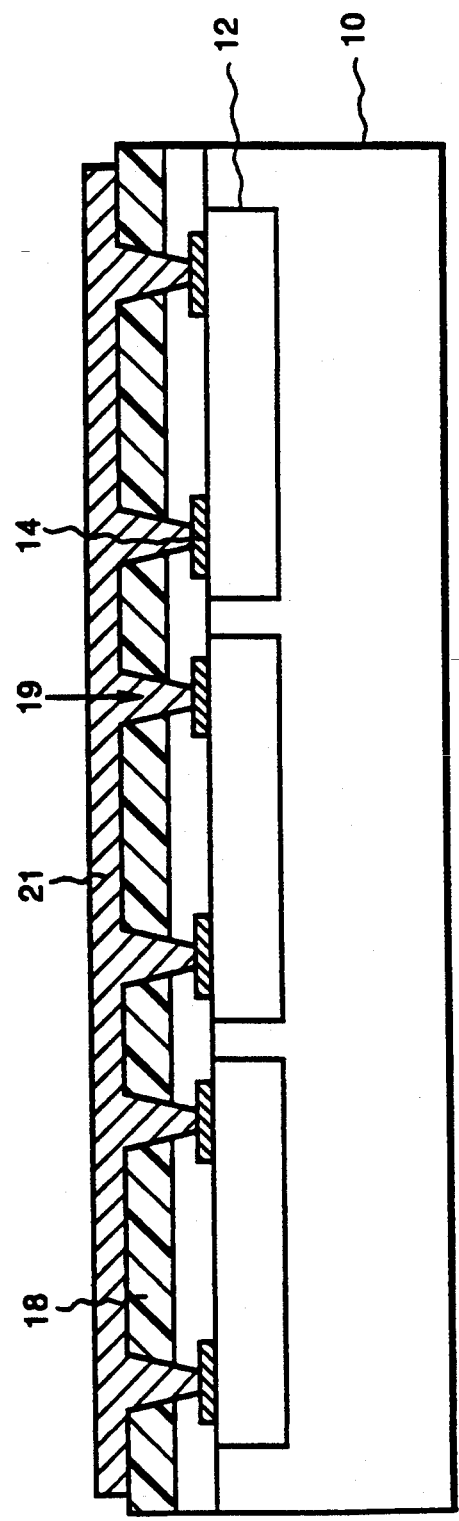
FIG. 2 is a cross-sectional side view illustrating the addition of vias and a ground plane to the wafer and dielectric layer of FIG. 1.

FIGS. 1 and 2 relate to the processing of an integrated circuit package at the wafer level using an overlay interconnect technique. This processing may be used both as a method of constructing an overlay interconnect assembly and as a method of developing a testing procedure for ICs which is not limited to use in an overlay interconnect assembly.

FIG. 1 is a cross-sectional side view illustrating a dielectric layer 18 overlying a fabricated wafer 10. Wafer 10 is processed with the foreknowledge that the high density interconnect (HDI) process has excellent low inductance power and ground plane performance. This will influence chip 12 positioning for optimum treatment. Chips 12 represent sites of active die areas in a monolithic wafer and include integrated circuits and single components.

Prior to applying an interconnect pattern of electrical conductors which may be used both in the finished assembly and for testing the chips, wafer 10 must be coated with a dielectric layer 18. The dielectric chosen should allow for application with uniform thickness and have the fundamental ability to withstand burn-in electrical test voltages at temperatures as high as 150° C. for temporary use and as high as 300° C. for processing as a more permanent dielectric. Other desirable attributes include: freedom from pinholes which can cause premature electrical breakdown; process chemistry and temperature for bake and/or cure which will not damage the wafers chemically or mechanically by the formation of stresses which could warp or break them (fully reacted polymers are thus desirable); ability to be patterned with vias for contact to the underlying chip pads; ability to be metallized and withstand the chemistry used for metal etching; and ability to be easily removed from the wafer if repair is necessary or, if used as a temporary dielectric, at the conclusion of testing.

In one embodiment, after the dielectric is selected, wafer 10 may be processed using the basic HDI overlay method. The HDI overlay method involves using a temporary layer of dielectric, such as Kapton polyimide, which may be laminated to the wafer with glue 16, or other free standing film with glue on one side and a dielectric on the other. A method of performing the basic HDI overlay process is disclosed in commonly assigned U.S. Pat. No. 4,783,695, issued Nov. 8, 1988, which is herein incorporated by reference. Another method for lamination is disclosed in commonly assigned U.S. Pat. No. 4,933,042, issued Jun. 12, 1990, which is herein incorporated by reference. Following the lamination step, vias aligned with chip pads are formed through the overlay. One method of forming vias is by a laser dither step as is disclosed in commonly assigned U.S. Pat. No. 4,894,115, issued Jan. 16, 1990, which is herein incorporated by reference.

In another embodiment of the invention, dielectric layer 18 would be fabricated by using a photosensitive polyimide with mask exposure. In this embodiment, a coating of as much as 25 $\mu$m of photosensitive polyimide such as Probimide 300 or 400 series (Probimide is a trademark of Ciba Geigy) or Pyralin PD PI2700 series (Pyralin is a trademark of E. I. dupont de Nemours and Co.) is applied by spin coating on the wafer (since glue 16 is not needed for this technique, layer 18 would thus be in direct contact with wafer 10). The coating is then baked at temperatures ranging from 60° C. to 100° C. to remove solvent and partially imidize a polyamic acid to a polyimide. Vias are then formed in the polyimide by exposing the coating through a mask so that, for a negative acting resist case, the areas which are exposed will be crosslinked and will remain as the dielectric. The unexposed areas are developed and removed. For a positive resist case, the via areas are exposed through the mask, and the exposed resist can be developed and removed by a suitable developer/solvent, while the areas under the mask are unexposed and remain insoluble as the dielectrics. The dielectric is then stabilized by curing at 350° C. to 400° C. This process, which can involve temporary or permanent dielectrics, avoids problems of wafer stress and has the advantage that the materials act simultaneously as dielectrics and as photoresists.

In some cases, photosensitive polyimides may be used with maskless exposure. If its wavelength is appropriate, a laser used as a photoplotter may be used to expose appropriate photosensitive polyimide in the positive or negative acting mode, as described above, thus eliminating the use of masks and permitting faster turnaround and greater flexibility in matters such as the placement of vias and the formation of multiple vias. The information for placement of the via patterns by the photoplotter is obtained from a databank similar to that needed by a mask supplier.

Because the thermal and mechanical stability of the dielectric for purposes of further processing and of electrical burn-in testing need not be greater than 150° C., a number of commercial photoresists may be suitable as photoimageable temporary dielectrics 18. After patterning of the vias, a hardbake at temperatures of 200° C. or more makes such resists sufficiently thermally stable to prevent flow and closure of the vias.

Another alternative dielectric overlay 18 can be formed by use of a spun or sprayed-on dielectric through which vias can be formed by direct laser ablation in the basic HDI process discussed above. Such materials can be polymers such as fully imidized polyimides, polyetherimides, benzocyclobutene, Teflon polytetrafluoroethylene, polymethyl-methacrylate, or others which can absorb the laser energy sufficiently to be ablated without damage to the underlying chip pads, are thermally stable at 150° C., and are compatible with subsequent application and test patterning of the electrical conductors.

More conventional photolithographic techniques and materials can also be used as embodiments of this invention. For example, the thermoplastics mentioned above may be applied by conventional spinning, spraying, meniscus coating, extrusion, or other techniques, while other materials can be deposited by plasma polymerization or other vapor phase techniques. These can then be thermally processed and coated with an appropriate negative or positive photoresist which can then be patterned by a mask or with a laser photoplotter. After development to form the via patterns, dry etching, e.g., reactive ion or plasma etching, or selective wet etching is performed to form the actual vias in the dielectric. A drawback of the photoresist mask process is the frequent need to form and pattern an intermediate "hard" transfer mask of metal or inorganic material placed over the dielectric before application of resist. The metal or inorganic material has a much lower etch rate in oxygen plasmas than the dielectric and thus is a more effective etch mask for it than most photoresists. These typically etch at similar rates to the dielectric in oxygen plasmas and must be thicker than the dielectric. Also, certain polyimides, e.g., the Ciba Geigy Probimide 200 series, can be overcoated with a positive photoresist in which vias are photopatterned. After a hardbake at 185° C., the Probimide material can be etched with a solution, such as Ciba Geigy QZ3296, to form the desired vias. The resist is then removed with a stripper such as Ciba Geigy QZ3298. The material has sufficient thermal stability to be used as a permanent dielectric.

FIG. 2 is a cross-sectional side view illustrating the addition of vias 19 and a pattern of electrical conductors 21 to dielectric layer 18 of FIG. 1. With vias 19 in their appropriate locations, the pattern of electrical conductors 21 can be applied by first backsputtering with argon the metal chip pad surfaces at the bottom of the vias and then sputtering metal which can be titanium, chromium, molybdenum, or any other metal that will act as a barrier metal to the subsequent metal deposition and whose subsequent removal will not destroy the metal (typically aluminum or an aluminum alloy) on the chips. In some cases, however, only one metal type may need to be applied by sputtering or plating steps. To build metal thickness above a few microns, if necessary, electroplating of a metal such as copper can be performed.

Next, a photoresist is applied. This may be a simple spin or spray on resist, an electrophoretic one such as the Eagle resist (Eagle is a trademark of Shipley Company), or a laminated PC board resist. Wafer 10 assembly, with dielectric layer 18 and the fully resisted metal, may now be HDI laser exposed by the adaptive lithography system as is shown in commonly assigned U.S. Pat. No. 4,835,704, issued May 30, 1989, which is herein incorporated by reference. At this point the adaptive lithography aspect of the system is not needed, as the alignment of the wafer parts is known; the metal could be patterned and etched by conventional nonadaptive laser photoplotting, as disclosed in U.S. Pat. No. 4,783,695, followed by wet or dry metal etch chemistry. The use of the adaptive lithography system is suggested to measure the pad placement of a run of the same wafers as a precaution. The wafer scale integration process by definition is done on a wafer basis, and a serialization coding of wafer good chip positions will be needed, along with a separate routing. A mask could be made to expose the wafer at this point as is presently practiced, but would be far more costly and time consuming. Following the resist exposure and development, the metals are etched in the conventional HDI etches, yielding a first level pattern of electrical conductors. A RIE (reactive ion etching) or excimer laser process is used to remove residual surface conductivity from the metal and dielectric interface.

The pattern of electrical conductors of FIG. 2 represents a multiple via 19 ground plane for high current bussing purposes. This ground plane may be a sheet with selected vias connected; more typically, the ground plane is a pattern of electrical conductors in a net configuration. Signal layers may be processed above or below the ground plane in normal practice.

The invention needs only one layer of interconnect. More levels may be added if useful. A spin-on SPI (silicon polyimide) followed by an SPI-Epoxy mixture, may be used as an interlevel dielectric (not shown), as is practiced in the present HDI process. Alternatively, a multi-layer lamination process may be used for interlevel dielectrics. The SPI layer is useful on the first level pattern of electrical conductors to act as a soft low stress release layer for repair in order to prevent chip pad damage. After the second level of dielectric is applied, vias may be dithered, metallized, and resist-patterned as previously discussed. Each layer, whether signal or power, is merely repeated as described above.

FIGS. 3 through 8 illustrate optional embodiments to improve the above disclosed wafer level assembly of a wafer scale integration circuit package using an overlay interconnect technique.

Figure 3:
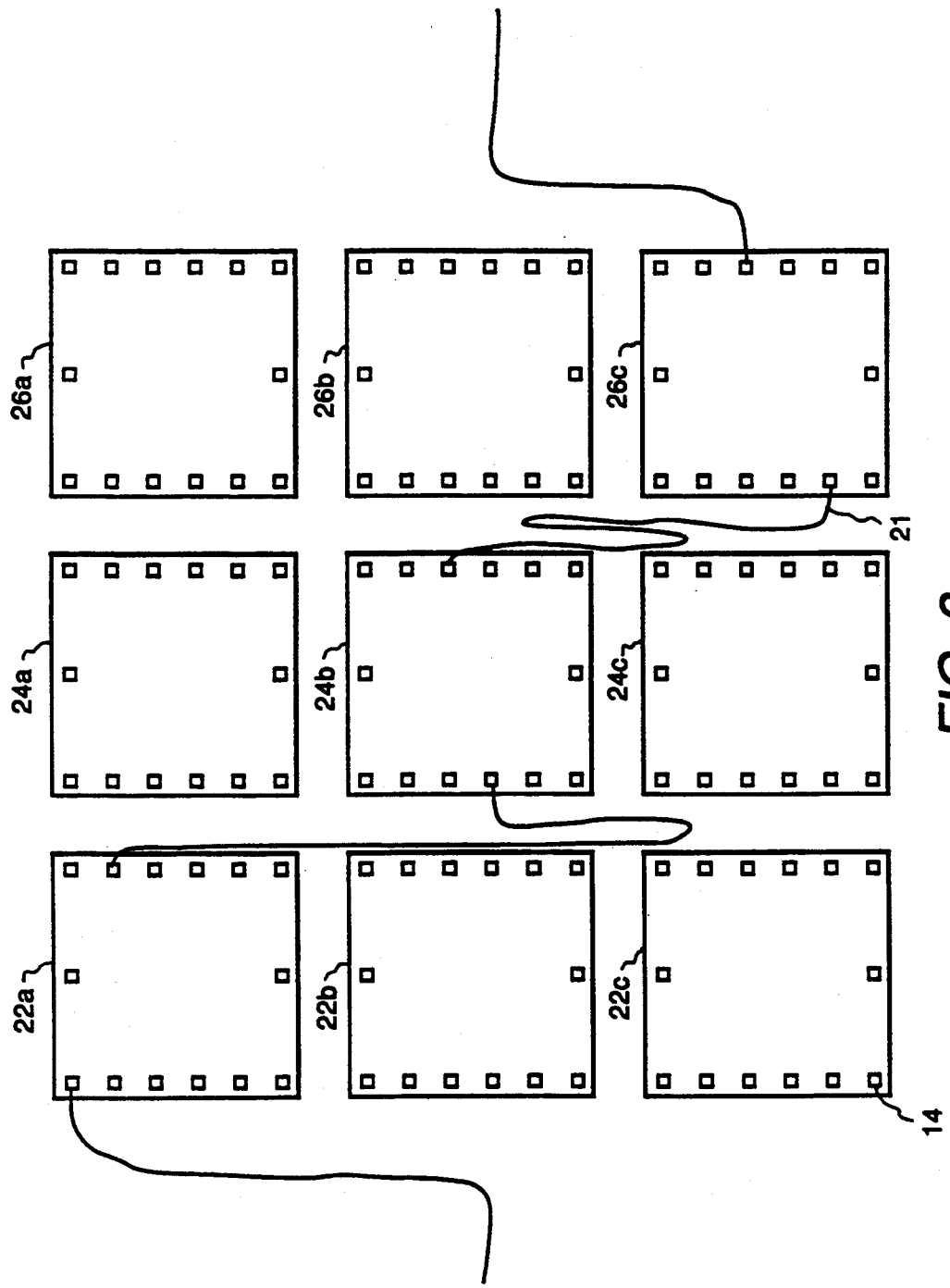
FIG. 3 is a top view of several redundant integrated circuits (ICs) and connections of one embodiment of the invention.

FIG. 3 is a top view of several redundant chips and potential connections of an embodiment of the invention. Wafer scale integration circuits generally incorporate redundancy in order to improve yields, as shown in FIG. 3 with chips 22a, 22b, and 22c being identical; chips 24a, 24b, and 24c being identical; and chips 26a, 26b, and 26c being identical. Afar a test probe, the faulted chips are identified and bypassed or eliminated from the completed circuit. Using conventional HDI processing, the sub-circuits may be connected in an "optimal fashion." For high frequency integrated circuits, for instance, the interconnections can be configured so that the conductor line lengths between sub-circuits on the same or different wafers are all the same, thus giving rise to substantial phase uniformity. The advantage of consistent line lengths (and thus phase uniformity) is not limited to HDI or wafer level integration; any method of ensuring substantially equal line lengths would work. This is important in the integration of high frequency circuits, since it is vital that phase tracking among various components be identical, particularly for such applications as phased array antenna modules. The conductor lines can be configured so that the lengths are the same by measuring the longest possible length and arranging all connections to be that length, as shown in FIG. 3 by the addition of extra length in the conductors in pattern 21.

Figure 4:
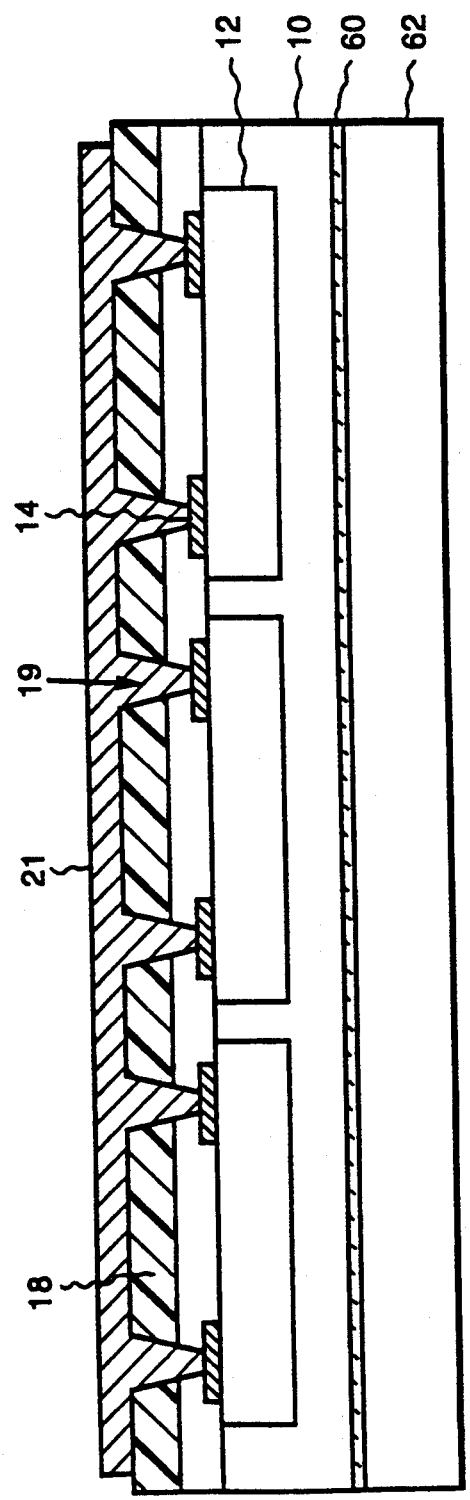
FIG. 4 is a view similar to FIG. 2 which illustrates the addition of a bias ply.

FIG. 4 illustrates another embodiment of the invention. Because so much handling of the wafer occurs in the wafer scale integration process, there is ample potential for breakage of very expensive assemblies. Single crystal silicon wafers are easily broken in normal processing. A biased ply structure 62 could be attached early in the wafer scale integration process to minimize the potential for breakage. Alternatively, the attachment may be made before or after the wafer scale integration process.

Silicon wafers of all the known lattice structures were evaluated. Use of an adhesive 60 to laminate a similar substrate 62 to wafer 10 containing chip pads 14 was found to greatly enhance fracture resistance of the structure. The best case was when two polished (top) surfaces or two unpolished (bottom) surfaces of wafers were attached together. In the case of finished wafers, the polished surface to polished surface hot laminated approach described below is a useful embodiment. Radial orientation of the crystalline lattice of the wafers relative to one another does not seem to be very critical and therefore the usual wafer fiats can be aligned.

The bias ply process may be accomplished by using a film adhesive 60 as the hot lamination medium. Materials such as Ultem polyetherimide resin (Ultem is a registered trademark of General Electric Company, Pittsfield, Mass.) or other polyetherimide materials, polyimides, polystyrenes, polysulfones, polyetheretherkeytone (PEEK), various acrylates, polyesters, and the like may be used in film form. Spin or roll coating methods of coating are also acceptable, but the film method is less costly to process. The two wafers, with the film in between are then hot pressed together with a Kapton polyimide film over a silicone pressure pad (not shown) to prevent damage. An organic adhesive is preferred over glass because glass does not yield the flexure results that organic materials provide. If the HDI laminator (not shown) is used, the Kapton polyimide film is not necessary, because an air bladder is used to evenly apply the pressure, as disclosed in U.S. Pat. No. 4,933,042. The press is heated to the melt flow point of the adhesive and cooled under pressure. Approximately 50-80 psi has been used successfully. This step can be done at the same time as the initial lamination on the wafer of the first level of dielectric (see discussion relating to FIG. 1). The edges are then trimmed and processing can proceed as before. This resulting bias ply provides break resistance improvement by a factor of five to fifteen on flexure and impact tests.

Figure 5A:
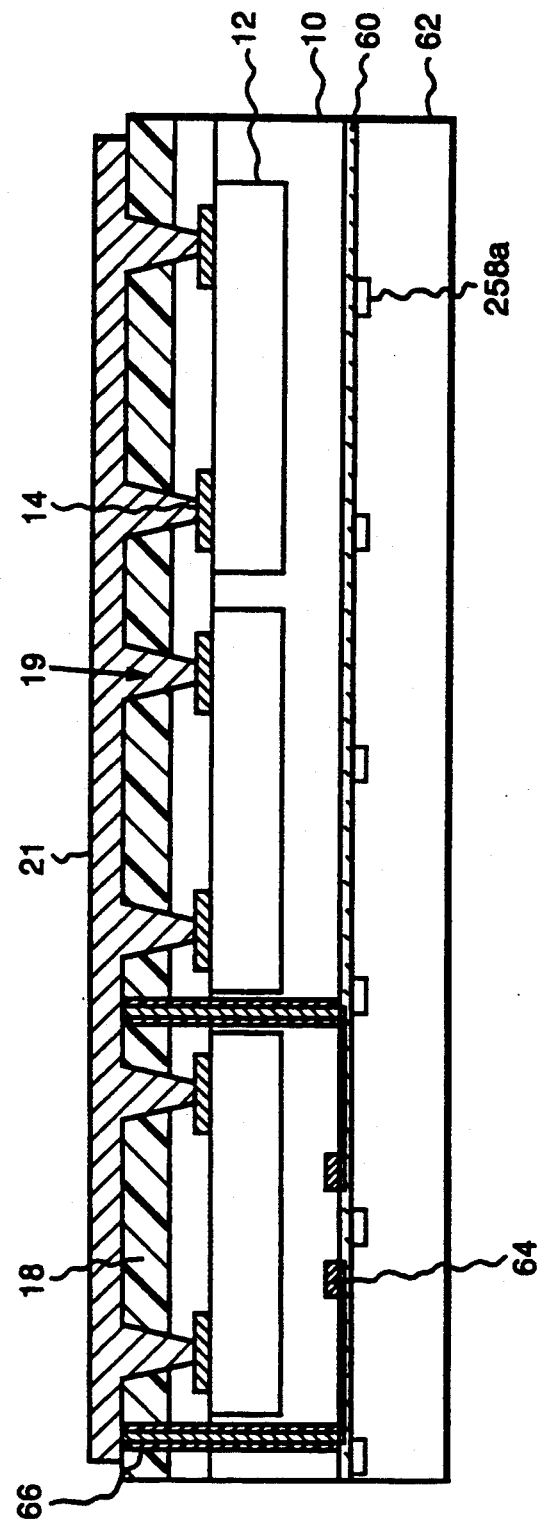
FIGS. 5a and 5b are views similar to FIG. 4 which illustrate the addition of a component located in the area of the bias ply.
Figure 5B:
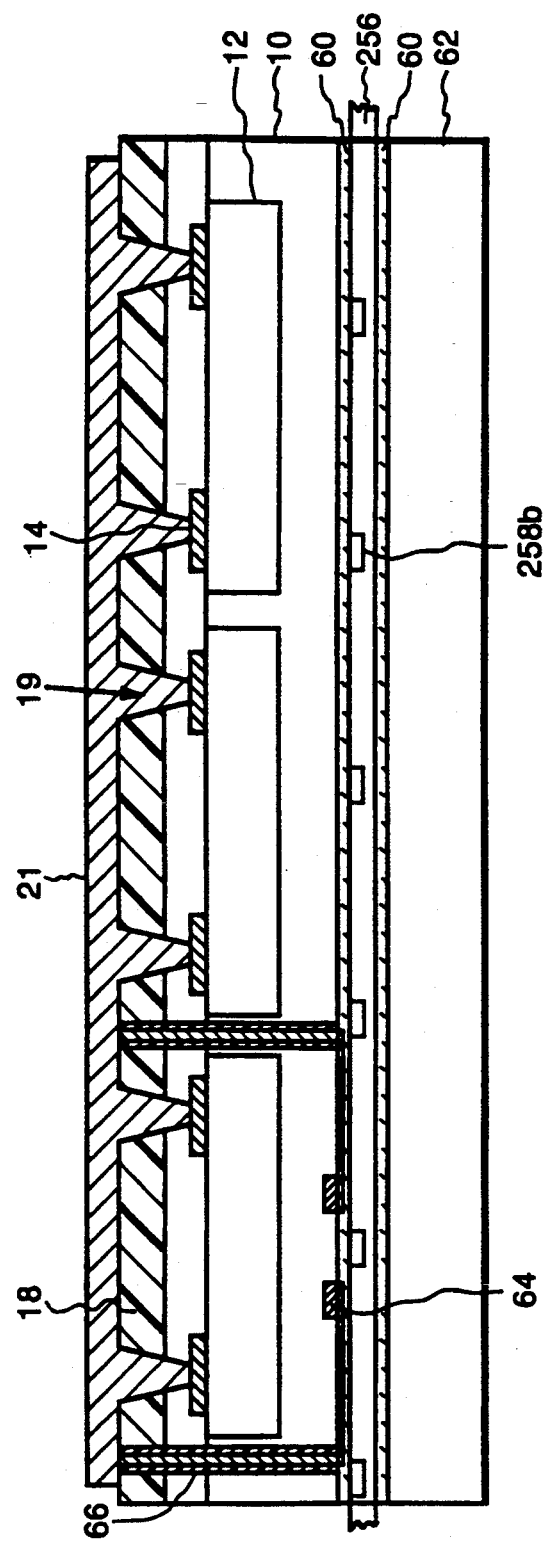

In another embodiment, as illustrated by FIGS. 5a and 5b, the space between wafers 10 and 62, in the adhesive area, is used for component 64 placement. Film capacitors, resistors, toroids, and other such components can be placed on the wafer sides facing the interface adhesive. A dielectric insulating layer (not depicted), such as, for example, $SiO_2$, is used to isolate the components. Insulated through vias 66 are used to interconnect the components and the upper or lower surfaces. A center heat removing plate 256 (shown in FIG. 5b), which may comprise, for example, nickel-cladded copper, can be provided with the appropriate insulating layers when components are placed in between the wafers. Cooling grooves 258a (shown in FIG. 5a) and 258b (shown in FIG. 5b) can also be employed for other cooling means. These grooves can be etched slots or can be tubular, to allow for a supply of cooling material such as water to be pumped through, and they may be configured in any appropriate pattern. The grooves should be kept free of lamination material during lamination of the wafers. These grooves can be located either in heat removing plate 256, as shown by grooves 258b in FIG. 5b, or in one of the two wafers, as shown by grooves 258a in FIG. 5a.

Figure 6:
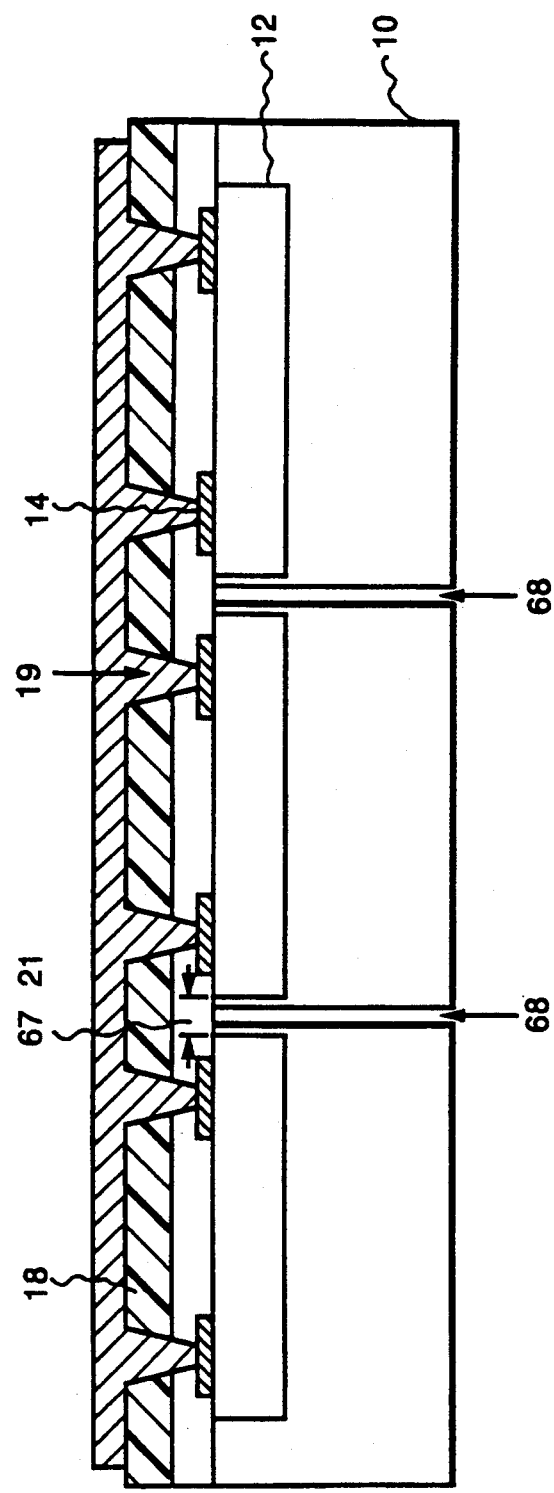
FIG. 6 is a view similar to FIG. 2 which illustrates the addition of saw cuts in the wafer.

FIG. 6 illustrates yet another embodiment of the invention by showing a cross-sectional side view of an enhanced wafer scale integration structure with the addition of curls (saw cuts) 68 in the wafer. These curfs serve two purposes. First, curls enable mounting the wafer to a desired surface which may not be flat (for example, the desired surface may be round or curved in a concave or convex manner). Also, curls relieve wafer stress and enable wafers to be mounted on materials that need not be exactly thermally matched to the package or mounting surface. The curls may be cut in any appropriate manner before, during, or after the wafer scale integration process.

In one embodiment, this process is performed by fully completing the wafer scale integration process as described above. Wafer 10 is then mounted upside down onto a mounting chuck (not depicted). A wafer saw, or a scribing tool is used to cut controlled curfs 68 into the wafer substrate. These curfs may be cut through to the interconnect layers. These cuts are made as wide as needed within scribe lane 67 (area between adjacent active die sites) allowances and may be wider (not shown) on the bottom to facilitate conformalization to non-flat surfaces. Wafer scale integration designs can allow larger scribe lanes at wafer fabrication if needed.

Once the wafer has been integrated and has had curls cut, it is ready for mounting, or to have other components added as noted below. A stiffening plate (not shown) may be added to the top, by a temporary glue or wax to aid in handling magnetic mounting. A wafer may be merely cut in one place, such as in the middle, and folded back upon itself or upon a heat sink between its two portions to form a bias ply structure as noted above. This enables ninety degree bending of wafer scale integration structures.

The curfs that are cut into the wafer relieve the accumulated stress build-up (and thus reduce wafer scale integration to an HDI mechanical reality) of individual chips with a bridge structure in between. In addition to silicon wafers, alternative, more durable substrates such as alumina ($Al_2O_3$), can be used with this embodiment since the differential thermal expansion issues are solved. This allows mounting of wafer scale integration to be a manageable problem, and greatly minimizes the breakage issues that are common in wafer handling.

Figure 7:
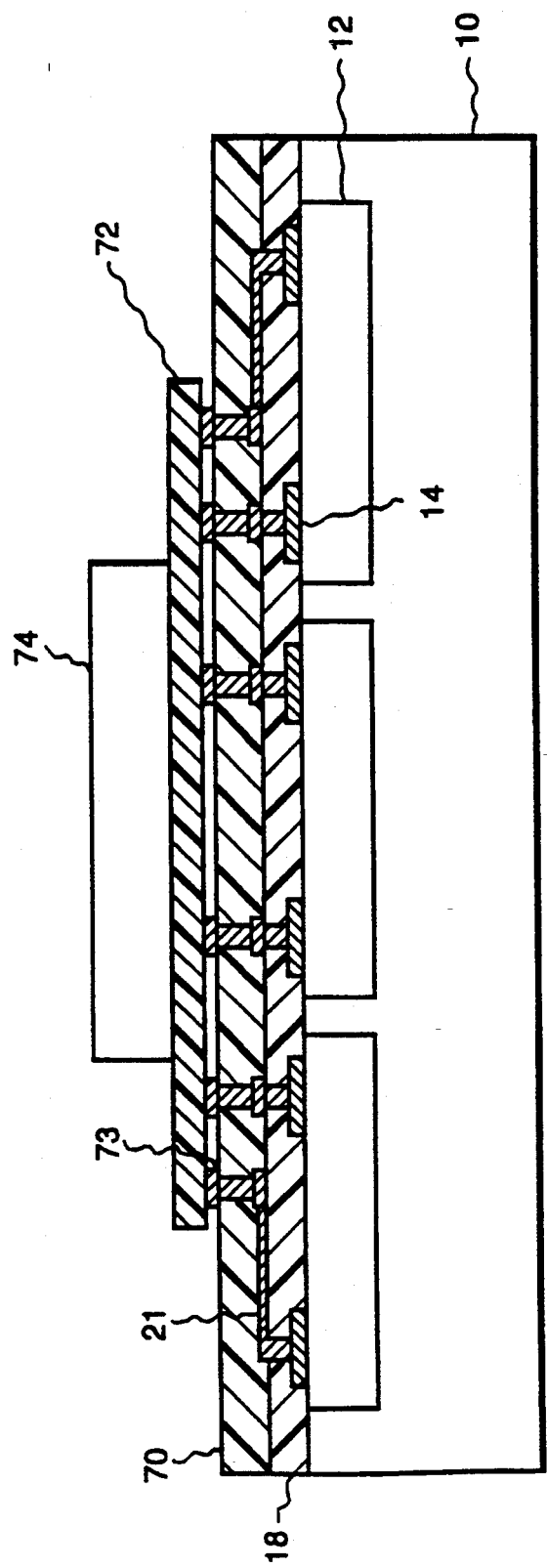
FIG. 7 is a cross-sectional side view illustrating several dielectric layers overlying a fabricated wafer, a pattern of electrical conductors, and the addition of an IC on top of the wafer scale integration interconnects.
Figure 8:
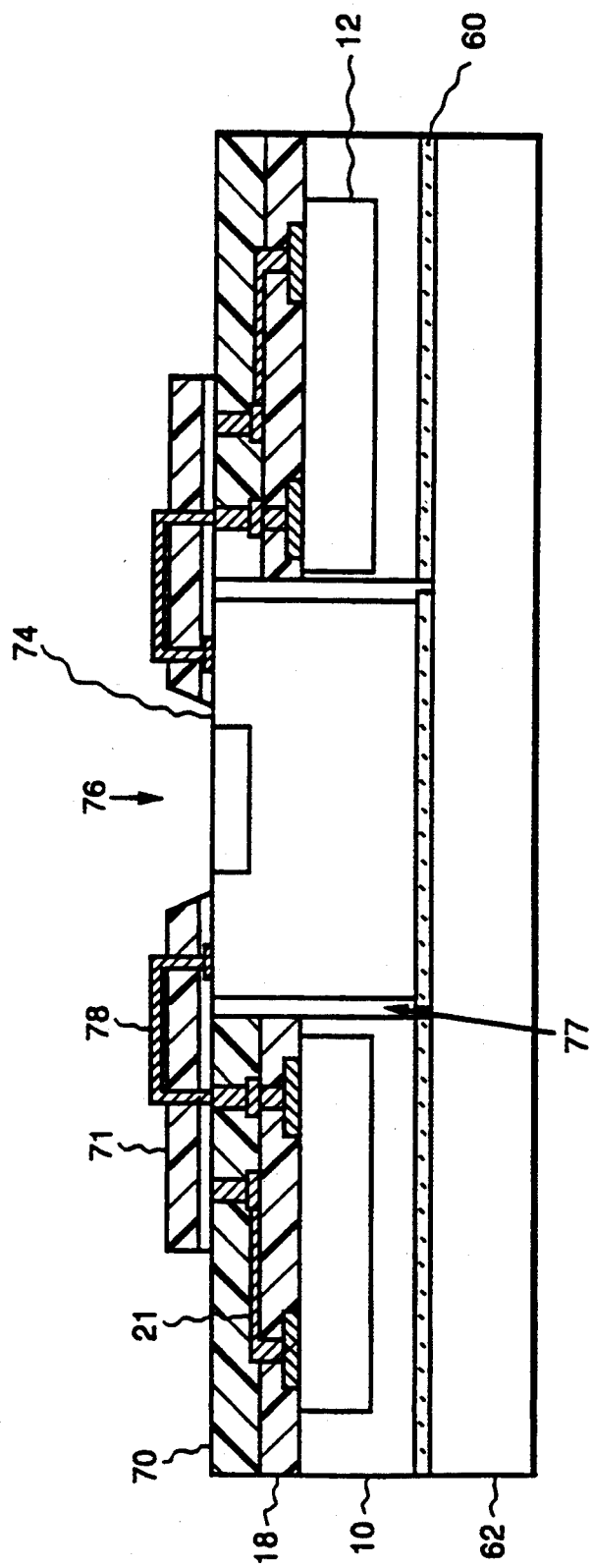
FIG. 8 is a cross-sectional side view illustrating several dielectric layers overlying a fabricated wafer, a pattern of electrical conductors, and a pocket milled into the wafer with an additional IC inserted.

In other embodiments, such as shown in FIGS. 7 and 8, after completion of the enhanced wafer scale integration process, sensitive components of other technologies are now added. GaAs, InSb, HgCdTe, and other chips 74 may be placed on or into wafer 10 as noted in U.S. patent application Ser. No. 07/962,379 and U.S. patent application Ser. No. 07/962,449. This permits complete processing and testing of an HDI assembly prior to the placement or insertion of temperature sensitive components which cannot withstand the normal processing temperatures. Such configurations ease repair as chip 74 may be replaced without removing the layers of the HDI assembly.

More particularly, as illustrated in FIG. 7, in one embodiment, a temperature sensitive component of other technologies such as a GaAs, InSb, or HgCdTe chip 74 may be mounted on wafer 10 by methods including TAB (tape automated bonding) 72 and wire bonding (not shown). FIG. 7 shows a TAB fabricated configuration using solder bumps 73. Although a single dielectric layer 18 would be sufficient, an embodiment may have multiple dielectric layers, if desired, as shown by second dielectric layer 70. Further methods and considerations related to top mounting are disclosed in allowed U.S. patent application Ser. No. 07/504,749, filed Apr. 5, 1990, which is commonly assigned. If top mounted components are to be used in association with a wafer with curls which is to be mounted on a surface which may not be flat, the top components may be mounted after the wafer is mounted on the nonflat surface to minimize stress on the components and interconnects.

Alternatively, as illustrated in the embodiment of FIG. 8, devices 74 may be milled into the wafer in various pockets 77 created during the wafer scale integration process. The use of bias ply wafer 62 is not normally necessary for the milled-in chip assembly where the part is thin in comparison to the wafer thickness. In cases such as illustrated in FIG. 8 where the chip 74 is milled through the top wafer for coplanarity with the wafer, a bias ply 62 adds considerable structural integrity and minimizes wafer stress. Pad outs or pin outs of the wafer, to the next layer of interconnect, may be positioned at the edge of the wafer, or may be brought to the top surface and top connected to the next layer of interconnect. HDI and TAB are also options. If HDI is used, a connecting dielectric layer 71 and connecting pattern of electrical conductors 78 are applied ("connecting" dielectric layer 71 being so-called due to its function of supporting "connecting" pattern of electrical conductors 78), and an ablation may be used to open a chip view window 76, if desired. The method of pin out connection may be influenced by a stacking configuration which would cause one option to be more beneficial than the other option.

Top mounted components or milled components with a chip view window are useful in scanner or sensor applications because they provide visual sensor capability. As discussed in U.S. patent application Ser. No. 07/962,379 and U.S. patent application Ser. No. 07/962,449 these sensitive devices can be integrated into or onto a parent HDI flexible substrate for ease of processing and repair.

Figure 9:
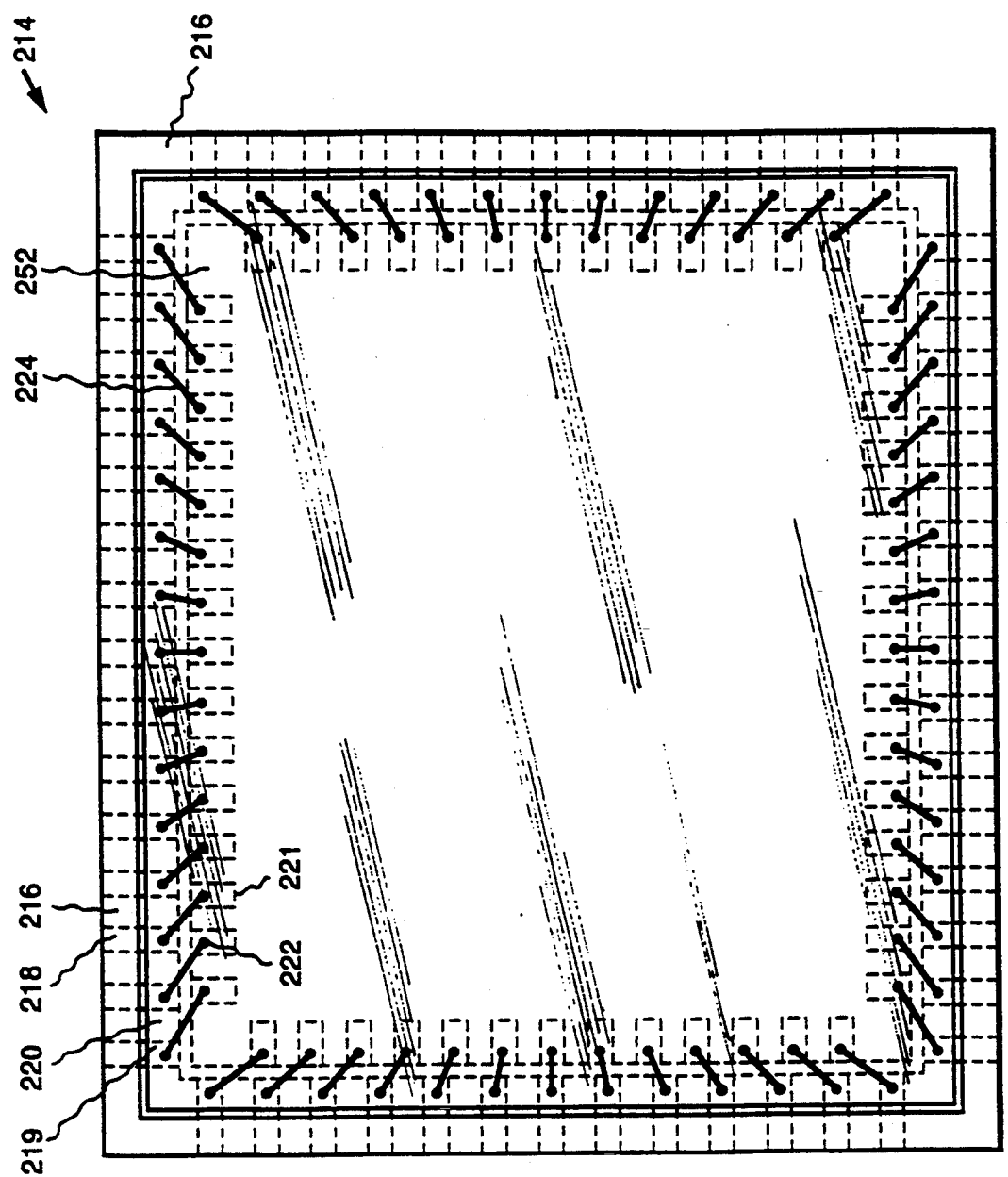
FIG. 9 is a top view of a wafer interconnected to an interface ring.

FIGS. 9 through 12 relate to interface ring stacking approaches with three-dimensional capabilities for wafer level interconnects. The embodiment of FIG. 9 shows, in top view, an interface ring 214 and a large cut out or sawed out portion of a wafer 252 positioned inside of the ring assembly. The term "wafer" 252 as used in the context of the interface rings of FIGS. 9–10 refers to either a monolithic wafer or an HDI module (which emulates a wafer). The term "positioned" is meant to encompass both the situation wherein the wafer is placed inside the ring and the situation wherein the ring is placed around the wafer resulting in the wafer being inside the ring.

Figure 10:
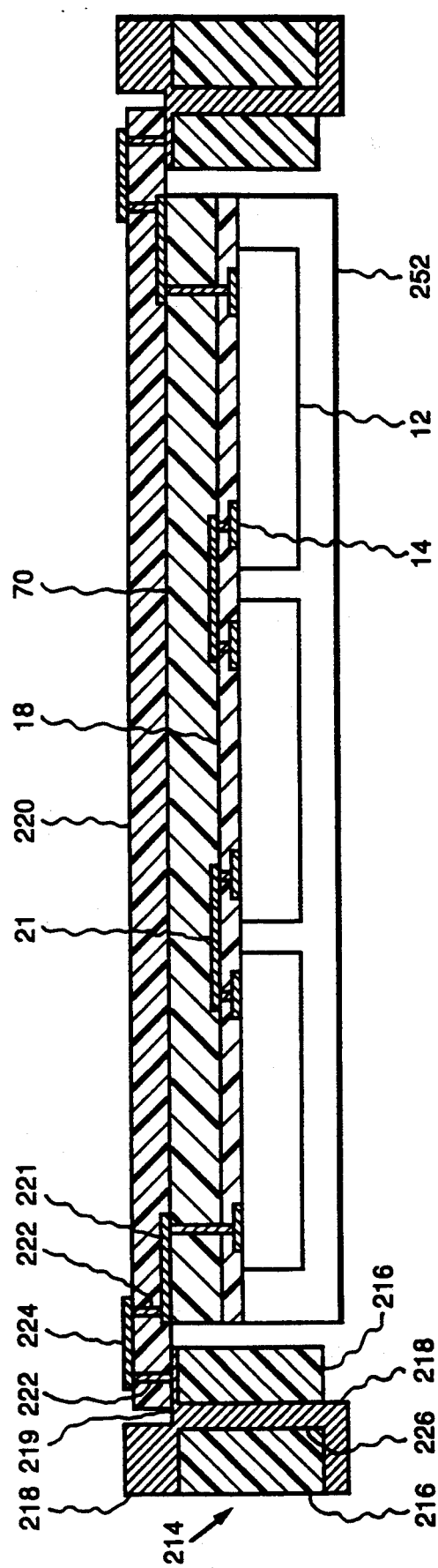
FIG. 10 is a cross-sectional side view of a wafer connected the an interface ring.
Figure 12:
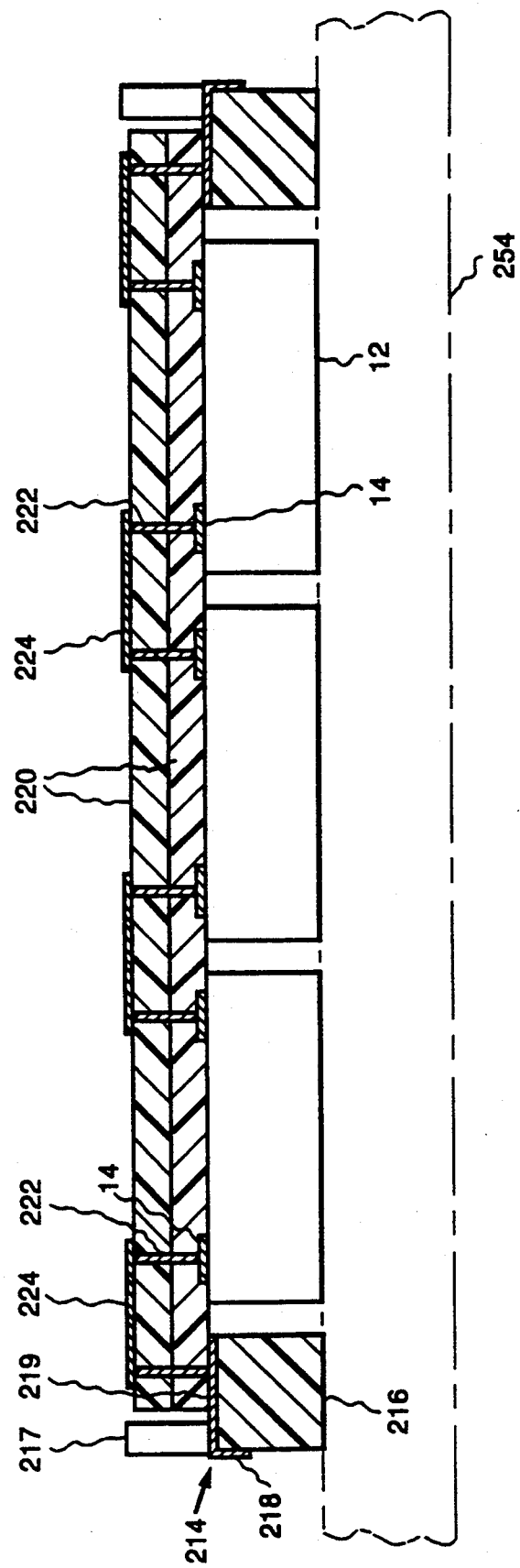
FIG. 12 is a cross-sectional side view of several ICs interconnected to an interface ring.

As shown in FIGS. 10 and 12, ring 214 may be constructed of any appropriate insulating material 216 such as a PC (printed circuit) board, insulated metals, or ceramics, and may be any shape to accommodate parts to be placed inside the open area. In one embodiment, a thick film ceramic process is used. The ring also contains electrical conductors 218, which have ring pads 219 interconnected with HDI interconnect pads 221 (shown in FIG. 10) or interconnected with chip pads 14 (shown in FIG. 12). The conductor may comprise any appropriate material. In one embodiment the ring pads may be gold or gold flashed to allow a non-corroding connection. Alternatively, a ring may be of sufficient thickness so as to allow the use of elastomeric anisotropic interconnection materials. FIG. 10 shows one embodiment wherein the ring has a pre-fabricated multi-level through via 226 for top to bottom passthrough of power and signals. Insulating material 216 (shown in FIG. 10) may extend into the area of the ring not occupied by conductors 218 so that conductors 218 and insulating material 216 in FIG. 9 are approximately the same height. FIG. 12 shows another embodiment wherein conductor 218 of the ring wraps around the ring to contact the outer surface of the ring and spacer 217 (which may comprise any suitable structural material) is useful for providing a flat stacking surface for subsequent assemblies.

In the embodiment illustrated in FIG. 10, a wafer constructed by the process discussed with respect to FIGS. 1 and 2, or by current HDI processing as disclosed, for example, in U.S. Pat. No. 4,783,695, is positioned inside ring 214. Layer 18 represents a first connecting dielectric layer while dielectric layer 70 shows that, although not necessary, there may be multiple connecting dielectric layers. Then the wafer is interconnected to at least one electrical conductor 218 of the ring by any appropriate manner, including HDI and conventional methods of wire bonding, solder bumping, and tape automated bonding. In embodiments using HDI methods, a dielectric layer 220 is applied over both wafer 252 and ring 214. Then vias 222 are drilled and a pattern of electrical conductors 224 are applied to connect the wafer to the ring. This embodiment of wafer-ring interconnection may be used both when ring 214 has through vias 226 and when the ring has a conductor contacting the outer surface (shown in FIG. 12).

Figure 11:
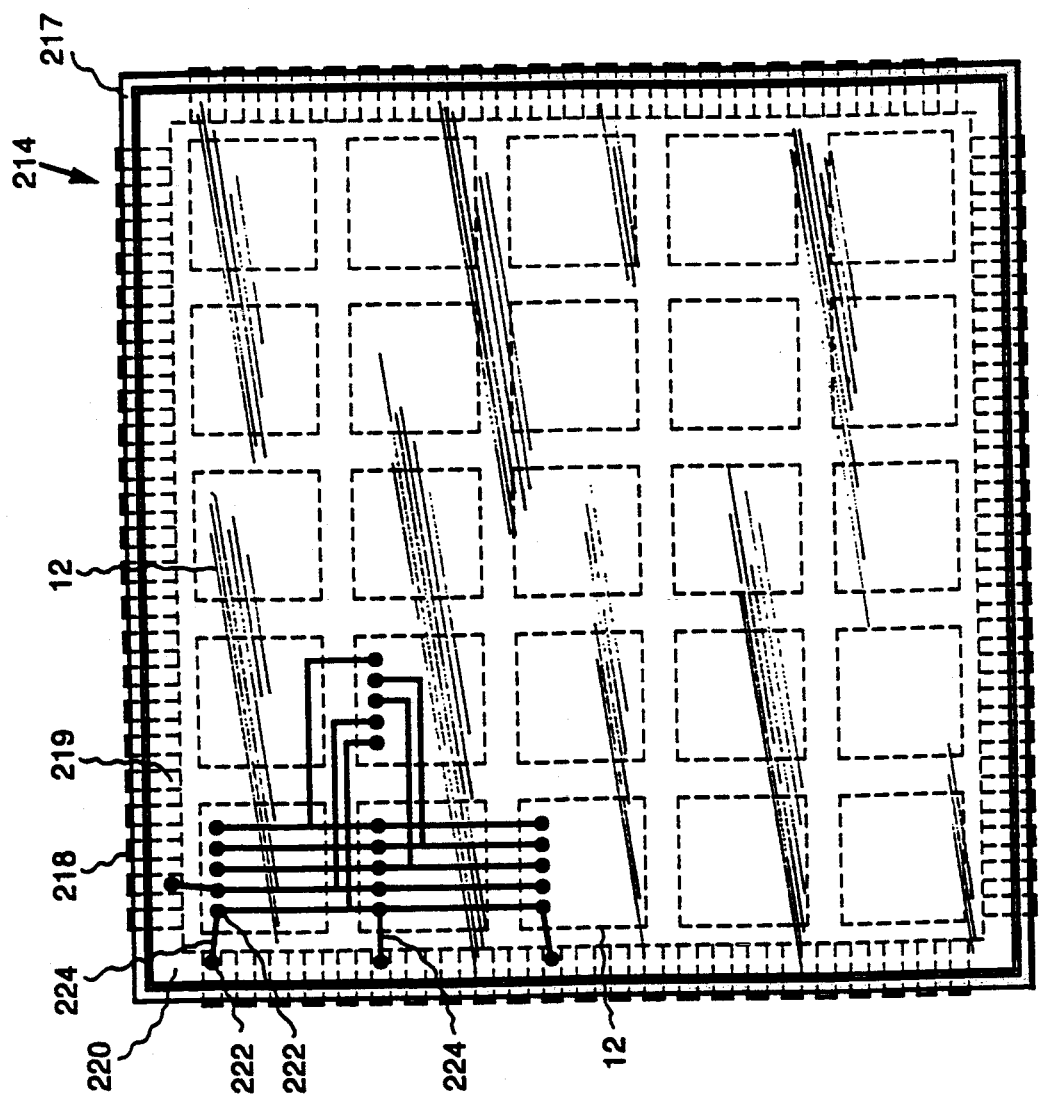
FIG. 11 is a top view of several ICs interconnected to an interface ring.

In another embodiment, as illustrated by the top view of FIG. 11 and the sectional side view of FIG. 12, chips 12 are positioned in a temporary carrier 254 (shown in phantom in FIG. 12) for holding the chips for lamination to the interface ring while applying dielectric layer 220. Chips 12 may be individual chips 12, as shown in FIG. 12, or chips 12 may be chips located in a wafer (not shown in FIG. 12). As shown in FIG. 12, dielectric layer 220 is comprised of a double lamination to provide sufficient thickness to insert an additional chip (not shown), if desired. Alternatively, a thicker single lamination could be used. If no additional chip need be inserted, then a thinner layer could be used for dielectric layer 220. In one embodiment the carrier has pre-milled chip wells (not shown), for registration of individual chips, wafers, or portions of wafers. If desired, the carrier may be removed immediately after lamination. Adaptive lithography, as disclosed in U.S. Pat. No. 4,835,704, allows a wide variation in chip placement. This embodiment of chip-ring interconnection may be used both when the ring has through vias (shown in FIG. 10) and when the ring has a conductor contacting the outer surface (as shown in FIG. 12).

The interface ring may be designed so that when HDI methods are used to connect the wafer (or chip(s)) and ring, the resultant assembly is planar, thus improving the progressive stacking capability of these individual wafer (or chip(s)) and ring assemblies. Portions of wafers and individual chips may be placed within the same stack (not shown) in the same or different layers and thermal media may be placed between the stacked layers. Examples of thermal materials are elastomeric thermal pads and thermal greases. After these thermal layers are prepared, the registered interface rings of the type having pre-made multi-layer through vias 226 (shown in FIG. 10) may be stacked together and pressure clamped to form electrically conductive connections between layers. Defective layers may thus be removed or additional layers may be added to the stack as desired so as to provide unique test capabilities. Any clamp employed needs to be adjusted for the different heights. Additionally, the layers may be glue bonded together (thus eliminating the need for continual clamping) and layers of the type having the wrap-around ring conductors 218 shown in FIG. 12 may undergo conventional three-dimensional HDI processing at their sides, as disclosed in commonly assigned U.S. Pat. No. 5,019,946, issued May 28, 1991, which is herein incorporated by reference.

FIGS. 13 through 21 relate to alternative embodiments of the invention for testing at the wafer level using an overlay technique. During testing, the wafer is contacted using conventional fixturing techniques such as flex probes, probe cards, spring contact assemblies, surface arrays, elastomeric contacts, or others. In this invention, a major advantage of using an overlay for testing is that any probing damage will be induced on the temporary test pads only and not the chip pads. A method for testing using elastomeric contacts is disclosed in allowed U.S. patent application Ser. No. 07/739,363, filed Aug. 2, 1991, entitled "Controlled Impedance Test Fixture for Planar Electronic Device," which is commonly assigned and herein incorporated by reference.

Temporary "test only" layers may be used to partition the wafer for ease of test, or test layers may interconnect certain aspects of the wafer in a test configuration. If multiple test layers are used, then power and ground or signals may be on several layers. These layers may be above and below the wafer. The use of boundary scan signals is discussed below in reference to FIG. 15.

Figure 13:
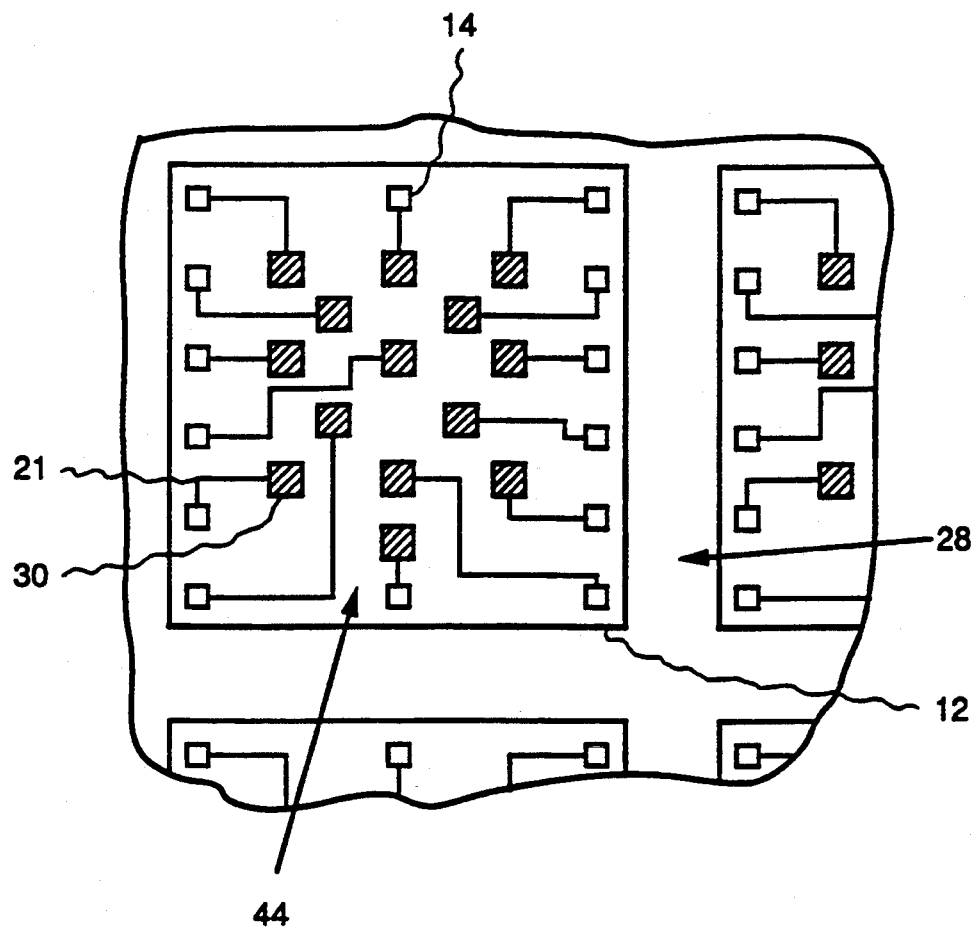
FIG. 13 is a top view of one IC and a corresponding test pad array.

FIG. 13 is a top view of one chip 12 and a corresponding overlay test pad array 44 without a boundary scan. This test pad array may be fabricated in accordance with any of the methods discussed with respect to FIGS. 1 and 2. The only difference is that the patterning of electrical conductors 21 enables testing and includes overlay pads 30 (which can be fabricated with adaptive lithography in the same manner as discussed in reference to FIG. 2). Normal testing of individual chips can be performed by contacting overlay pads 30 using conventional fixturing interfacing to conventional testers.

Figure 14:
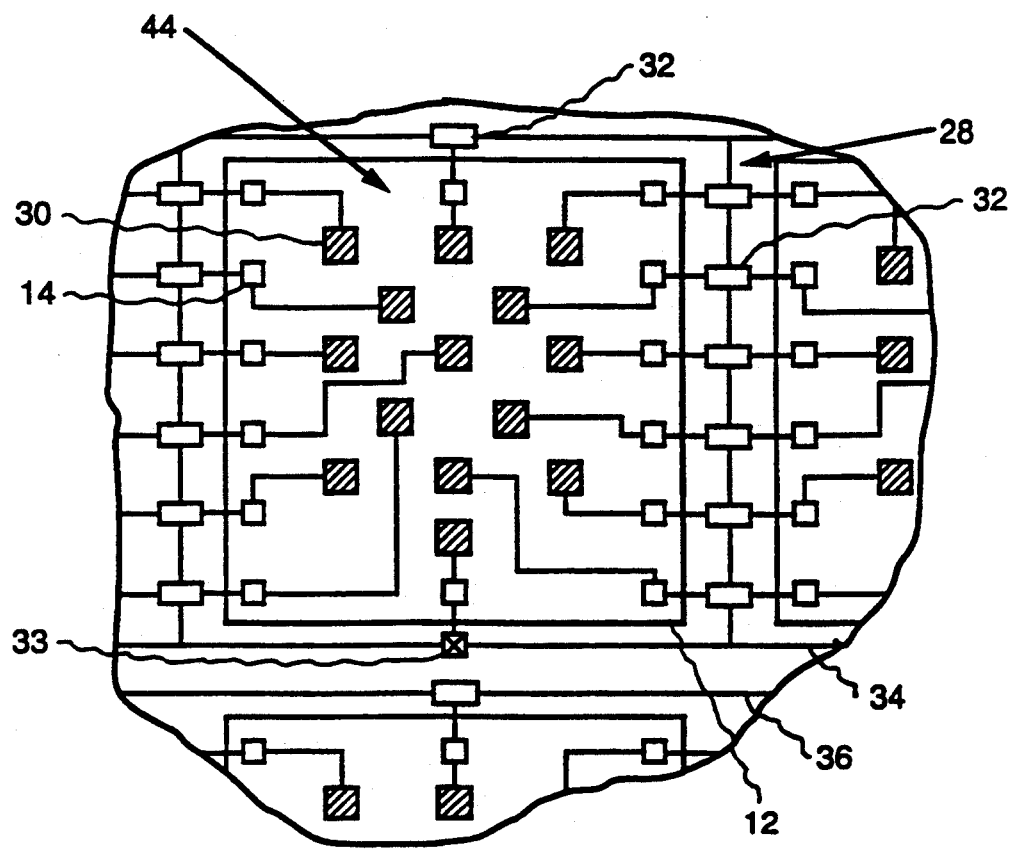
FIG. 14 is a top view of one IC, a test pad array, and burn-in connections.

FIG. 14 is a top view of chip 12 of FIG. 13 with the addition of burn-in connections. Static burn-in is possible by providing a resistor 32 or a fuse 33 to a common power bus 36 and/or common ground bus 34 for each signal on chip 12. The common power and/or ground buses will also provide power to the chip during the burn-in process and should be connected via fuses 33 or resistors 32 to allow the testing of individual chips in the presence of defective components. The supply distribution scheme may include sectioning of the wafer in such a way that different power and ground busses are used in different portions of the wafer. If a permanent overlay (i.e., an overlay that is not necessarily removed after testing) is used, the resistive connections and power bussing should be routed to the sawing streets 28 to allow proper chip operation after dicing, by disconnecting the burn-in wiring, as illustrated in FIG. 14. The placement of sawing streets is not critical if a temporary testing layer is used.

Figure 15:
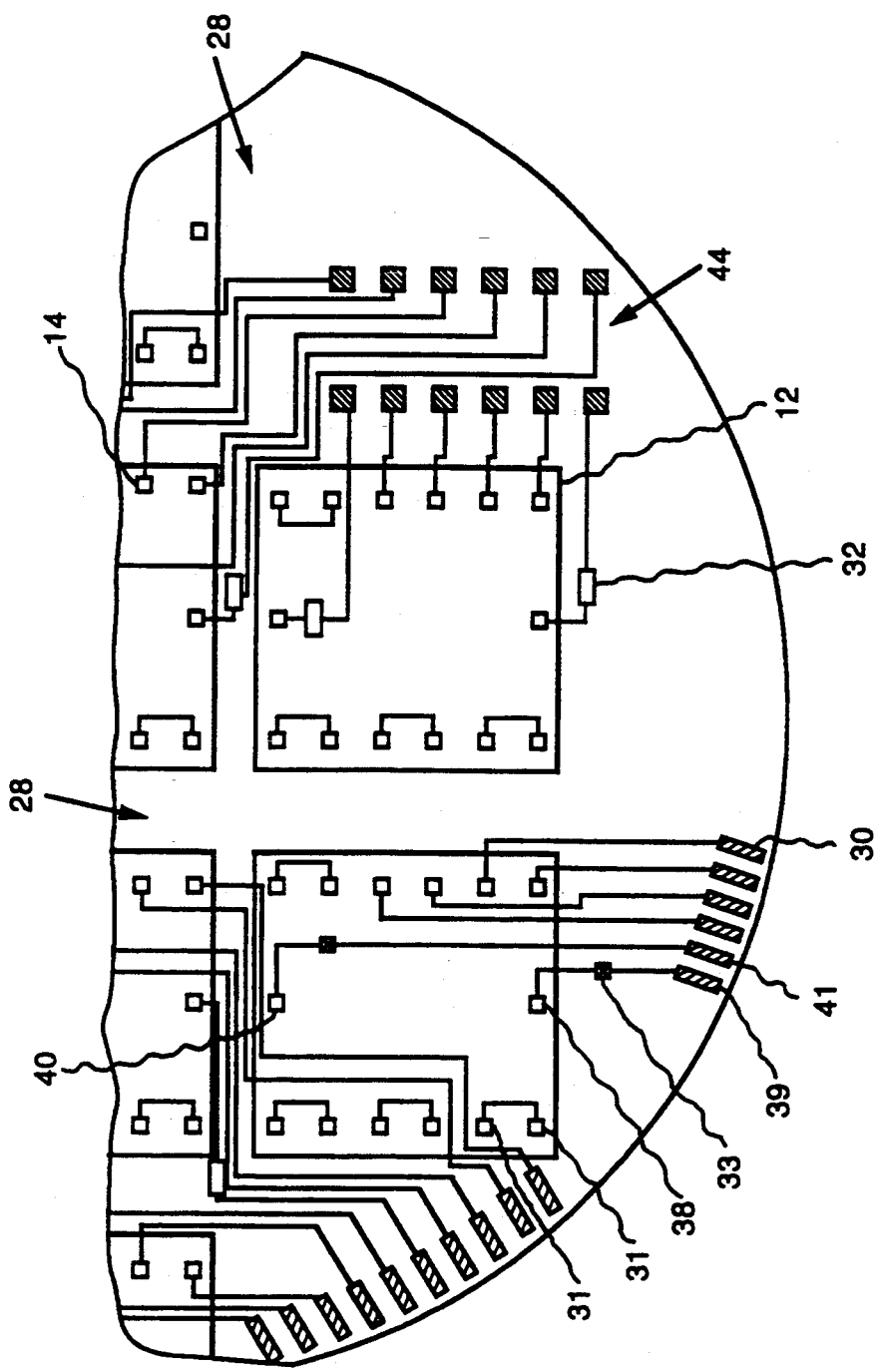
FIG. 15 is a top view of several ICs with test and burn-in pad arrays using boundary scan connections.

Illustrating another embodiment of the invention, FIG. 15 is a top view of several chips 12 with test and burn-in pad arrays 44 using boundary scan connections. For boundary scan based test and burn-in, using the IEEE1149.1 standard for boundary scan implementation on devices or other appropriate standard, the four boundary scan signals (test data in, test data out, test mode select, and test clock) of each chip are routed to the boundary (perimeter of wafer 10 or any other suitable area on the wafer to allow contacting). The remaining inputs and outputs (I/Os) 31 of each individual chip are connected in pairs, thus providing a way to test the entire chip, including its I/Os. Power bus 38 (which carries a power signal) and ground bus 40 may be routed to the outside in the same manner to power test pad 39 and ground test pad 41, respectively, thus resulting in 6 conductor lines which must be contacted per chip.

Figure 16:
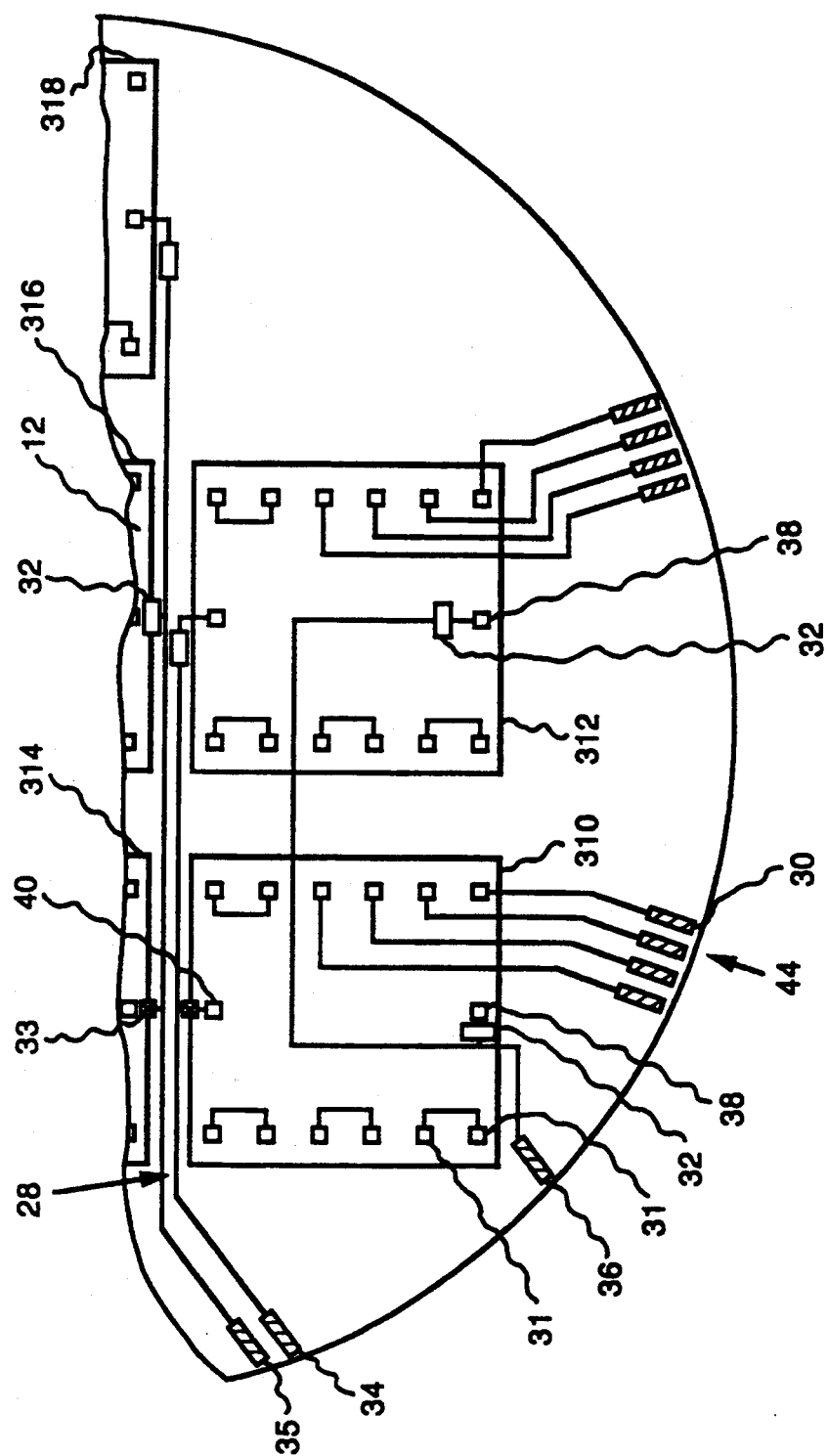
FIG. 16 is a top view of several ICs with test and burn-in pad arrays using boundary scan connections as well as common power and ground buses.

FIG. 16 illustrates an alternative embodiment for the configuration of boundary scan connections Power bus 38 and ground bus 40 may be connected to a common power bus 36 and a common ground bus 34, respectively, via resisters 32 or fuses 33 to prevent a single chip short from loading the busses, thus requiring only 4 conductor lines per chip plus a common power bus and common ground bus. It is also possible to divide the wafer into sections with each section having a common power bus and a common ground bus. For example, in FIG. 16, the bottom two chips 310 and 312 are depicted as having a common ground bus 34 and a common power bus 36, whereas the three partially-shown chips 314, 316, and 318 above form another section with its own common power bus 35.

Figure 17:
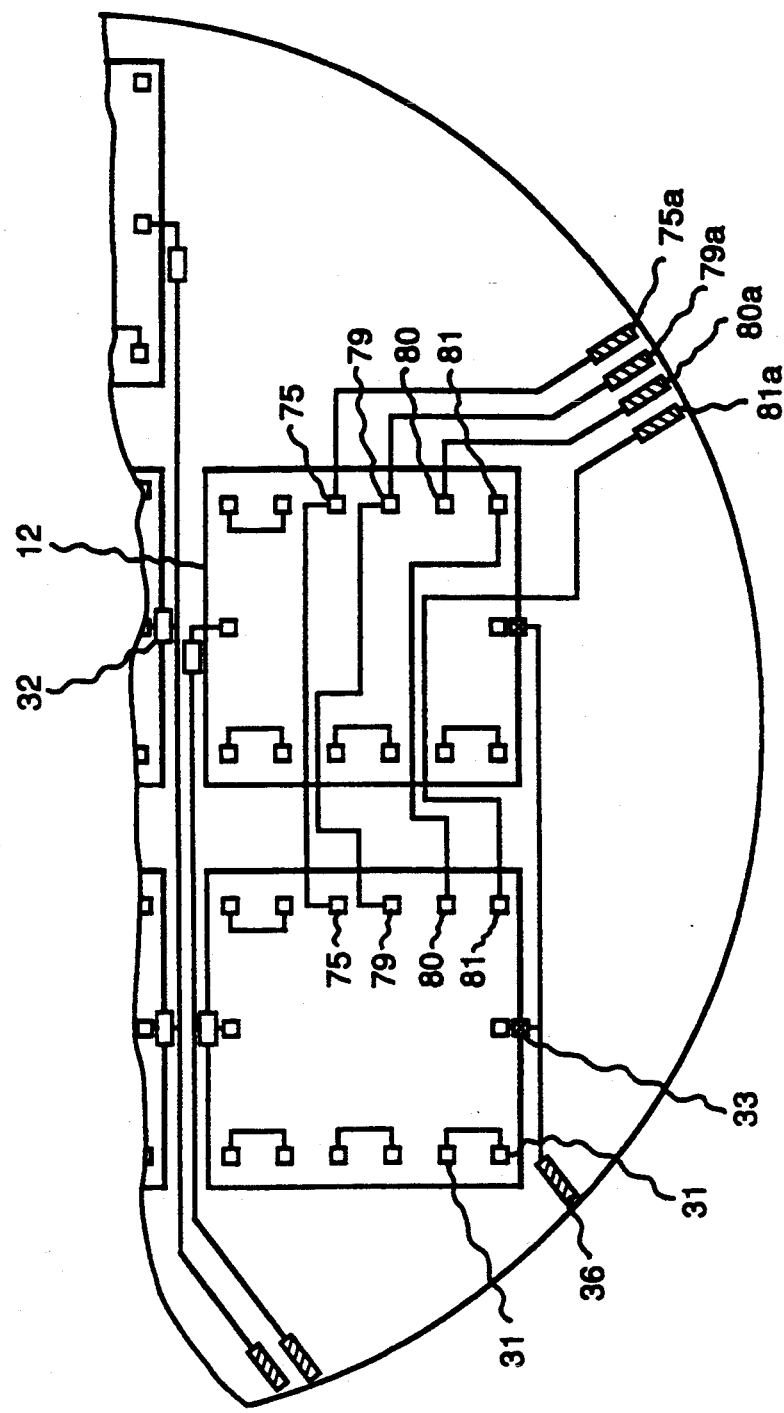
FIG. 17 is a top view of several ICs with test and burn-in pad arrays using boundary scan signals to connect multiple ICs in a chain.

As illustrated in the embodiment of FIG. 17, because boundary scan based testing allows chaining of individual cells on the various chips, several chip 12 sites may be connected in this way. Chaining is accomplished by connecting test mode select terminals 75 of all chained cells together to an overlay pad 75a, by connecting test clock terminals 79 of all chained cells together to an overlay pad 79a, and by connecting the test data out terminal 81 of one link of the chain into the test data in terminal 80 of the next link, with the boundary scan signals measuring the first test data in at terminal 80a and the final test data out at terminal 81a. In using this chain configuration in the presence of a faulty chip, however, it may not be readily apparent which specific chip is causing the problem.

Figure 18:
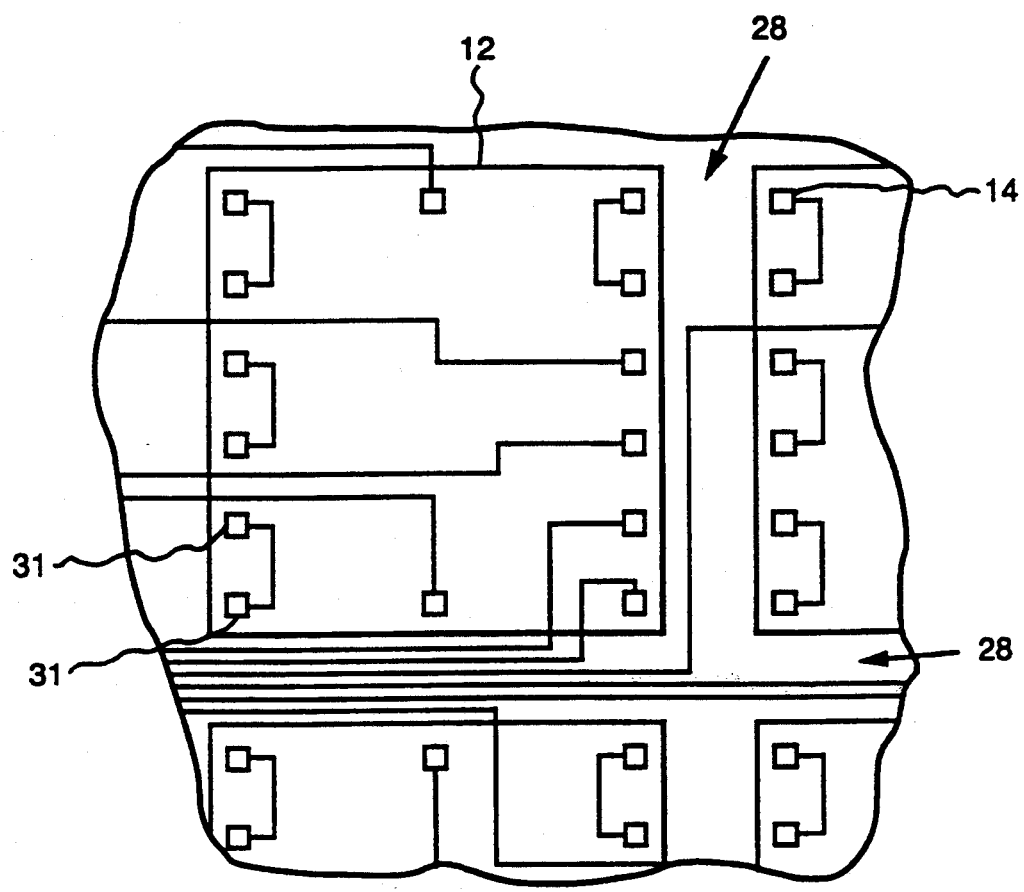
FIG. 18 is a top view of an IC illustrating sawing streets for a wafer that will have the test pad array removed.
Figure 19:
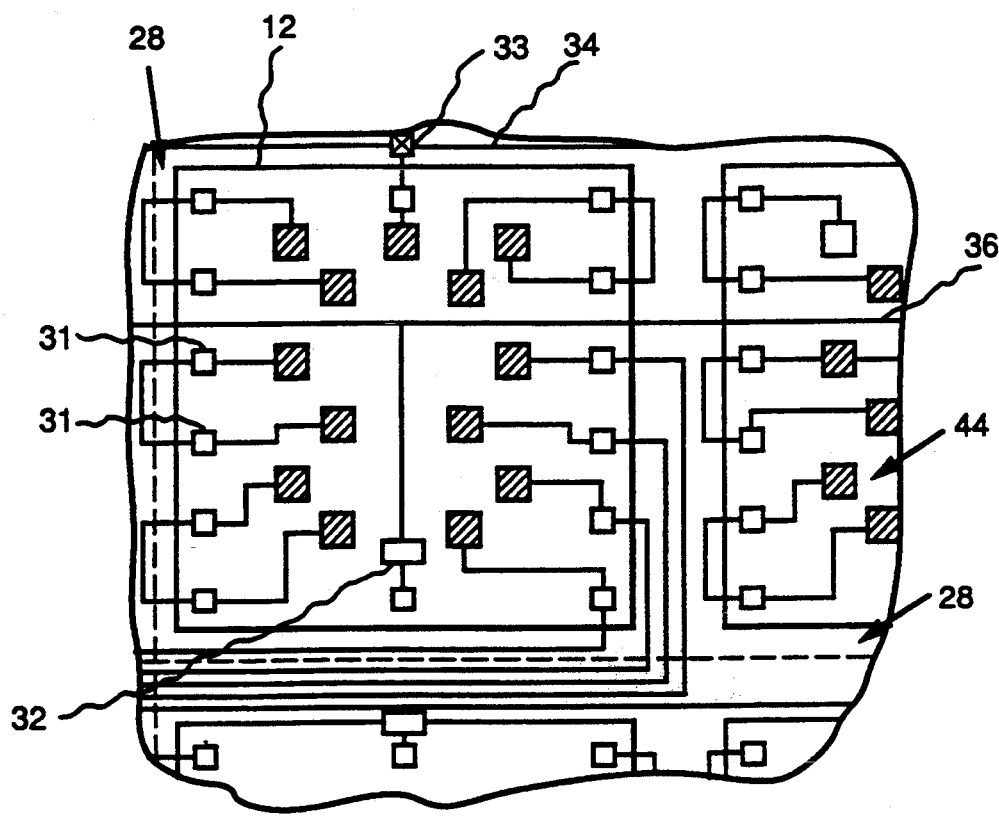
FIG. 19 is a top view of an IC illustrating the placement of sawing streets in relation to a permanent test pad array.

If the overlay array with boundary scan connections is of a temporary nature, the position of the paired connections of the remaining I/Os of the individual chips, as shown in FIG. 18, is not critical because the interconnects will be removed prior to sawing. However, if a permanent overlay is chosen the chip pads should be interconnected in the sawing streets 28 to allow proper chip operation after dicing, thus breaking the test and burn-in patterns of electrical conductors, as illustrated in FIG. 19.

Figure 20:
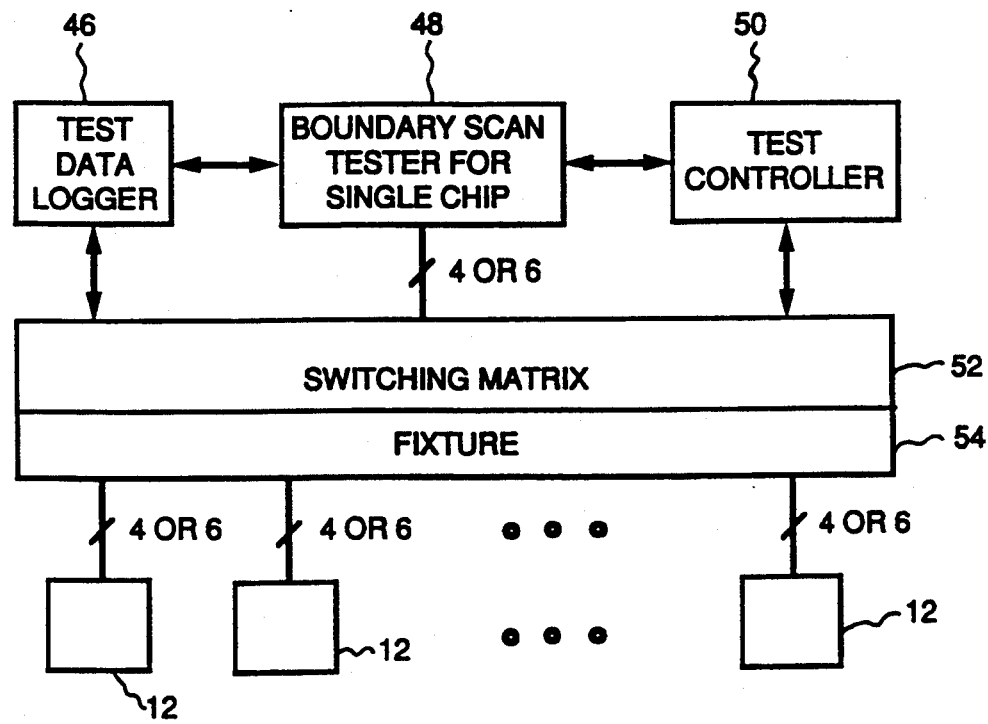
FIG. 20 is a block diagram representing a system for testing and burn-in using a single tester and a switching matrix to interface individual ICs.
Figure 21:
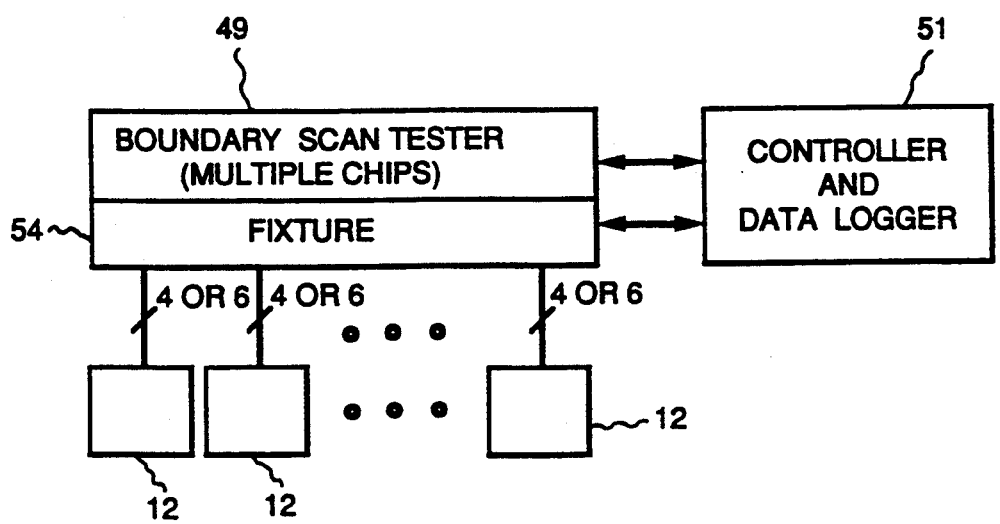
FIG. 21 is a block diagram representing a system for testing and burn-in using multiple testers.

During testing of boundary scan configurations, a wafer fixture 54, as shown in FIG. 20, connects chips 12 through a switching matrix 52 connected to a single boundary scan tester 48, or, as shown in FIG. 21, wafer fixture 54 connects chips 12 directly to multiple testers 49. During wafer testing, test patterns are applied that allow test of the entire chip through serialized parallel test vectors, boundary scan initiated chip self-test, and boundary scan I/O test. In the boundary scan I/O test, data is propagated along the scan chain by the overlay connecting adjacent pad pairs. In addition, limited parametric testing is possible. The boundary scan I/O test can be conducted over a range of temperatures and at high speeds using a properly configured test vector set. The results are written as an electronic wafer map into test data logger 46 or 51 of FIGS. 20 and 21, respectively. Active burn-in is possible, allowing chips to be continuously tested using the above test approach. Fixturing for boundary scan chaps is simplified because only a maximum of six conductor lines have to be connected for each chip (six lines are used if the configuration is similar to that discussed with respect to FIG. 15, and four lines may be used if the configuration is similar to that discussed with respect to FIG. 16).

After testing, the wafer may be used in an overlay interconnect assembly, as described with respect to FIGS. 1 and 2, or the chaps may be used in any other appropriate assembly. In one embodiment of the invention, the test metal is removed before the chaps are distributed and, if applicable, sawed. The test metal can be removed by wet etching, as discussed above. The dielectric layer 18 can be retained to serve as a scratch protection coating for the chips and remain on them until they are mounted, or if thermally stable, throughout the entire process.

In another embodiment, the test metal is removed and, additionally, dielectric layer 18 is removed by an appropriate solvent or by plasma ashing before any sawing. If dielectric layer 18 is a laminated layer, one removal method involves heating the structure and peeling off the layer, as disclosed in commonly assigned U.S. Pat. No. 4,878,991, issued Nov. 7, 1989, which is herein incorporated by reference.

In another embodiment, the test metal pattern and dielectric layer are removed, and a different dielectric layer and metal pattern are applied. As discussed with respect to FIG. 3, in one optional embodiment the pattern can be configured so that the conductor line lengths between sub-circuits on the same or different wafers are all substantially equal, thus giving rise to substantial phase uniformity.

Any pattern of electrical conductors may be reworked without removal of the overlay by first covering the surface of the interconnect structure with photoresist and then exposing the surface so as to leave resist in the via 19 areas. This may be simply done by a dither using the low power settings for the scan on the adaptive lithography system disclosed in U.S. Pat. No. 4,835,704. Following the laser dithering step, the photoresisted part is developed, and all electrical conductors other than the via areas are easily removed. Then the resist is removed by any of the resist stripping techniques discussed with respect to FIG. 2 and further described in U.S. Pat. No. 4,783,695. Electrical conductors may be reapplied in the desired configuration, in the same manner as if the conductors were being patterned for the first time. The advantage of this method is that it protects the chip pads from potential damage due to contact with chemicals during the removal of the electrical conductors. This method may be used as a repair process, as well as a process for changing the pattern of electrical conductors after testing has been completed.

In another embodiment of this invention, the test pattern pads 30, such as shown in FIGS. 14 and 15, for example, and which can be larger that the original chip pads 14 and spaced and placed differently, can remain on dielectric layer 18 as contact pads for the vias through an additional overlay. Vias in the additional overlay can then be made using conventional photomask processes and a plasma or wet etching, or laser ablation processes based on laser irradiation of the dielectric through a mask. If a permanent layer is used, any sawing step or metal etching step should cut any connections that are required for test and burn-in but are unwanted for normal device operation. Patterning of subsequent metallization and vias can therefore be done using conventional photomask lithography.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for testing enhanced wafer level integration interconnects, comprising the steps of:
    applying a dielectric layer to a wafer containing a plurality of chips, each chip having thereon input pads and output pads:
    providing a plurality of vias in the dielectric layer, each of the vias being aligned with at least one predetermined different one of the chip input/output pads:
    providing a testing pattern of electrical conductors and overlay test pads on the dielectric layer:
    contacting each of a selected configuration of the chip input/output pads through an associated one of the overlay test pads, to form a wafer level conductive interconnect test pattern; and
    routing a plurality of boundary scan signals and a power signal for each of the chips to a boundary of the wafer; and
    connecting the input pads and output pads of each of the chips in pairs.

2. The method of claim 1, wherein the contacting is performed by a device selected from the group consisting of flex probes, probe cards, spring contact assemblies, surface arrays, and elastomeric contacts.

3. The method of claim 1, in which the step of obtaining a test pattern comprises testing at least one chip through a switching matrix connected to a single tester.

4. The method of claim 1, in which the step of obtaining a test pattern comprises testing several chips using multiple testers.

5. A method for testing enhanced wafer level integration interconnects, comprising the steps of:
    applying a dielectric layer to a wafer containing a plurality of chips, each chip having thereon input pads and output pads:
    providing a plurality of vias in the dielectric layer, each of the vias being aligned with at least one predetermined different one of the input/output chip pads;
    providing a testing pattern of electrical conductors and overlay test pads on the dielectric layer:
    contacting each of a selected configuration of the input/output chip pads through an associated one of the overlay test pads, to form a wafer level conductive interconnect test pattern; and
    routing a plurality of boundary scan signals of each of the chips to a boundary of the wafer;
    connecting a plurality of power signals to a common power bus; and
    connecting the remaining input pads and output pads of the chips in pairs.

6. The method of claim 5, including the step of connecting said plurality of chips by chaining at least one individual cell on each of said plurality of chips.

7. The method of claim 5, wherein the contacting is performed by a device selected from the group consisting of flex probes, probe cards, spring contact assemblies, surface arrays, and elastomeric contacts.

8. The method of claim 5, in which the step of obtaining a test pattern comprises testing at least one chip through a switching matrix connected to a single tester.

9. The method of claim 5, in which the step of obtaining a test pattern comprises testing several chips using multiple testers.

10. A method for testing enhanced wafer level integration interconnects, comprising the steps of;
    applying a dielectric layer to a wafer containing a plurality of chips, each chip having thereon input pads and output pads;
    providing a plurality of vias in the dielectric layer, each of the vias being aligned with at least one predetermined different one of the input/output chip pads:
    providing a testing pattern of electrical conductors and overlay test pads on the dielectric layer:
    contacting each of a selected configuration of the input/output chip pads through an associated one of the overlay test pads, to form a wafer level conductive interconnect test pattern; and
    biasing the input pads and the output pads of the chips from a power bus and a ground bus through components selected from the group consisting of resistors and fuses, and performing a static burn-in.

11. The method of claim 10, wherein the contacting is performed by a device selected from the group consisting of flex probes, probe cards, spring contact assemblies, surface arrays, and elastomeric contacts.

12. The method of claim 10, in which the step of obtaining a test pattern comprises testing at least one chip through a switching matrix connected to a single tester.

13. The method of claim 10, in which the step of obtaining a test pattern comprises testing several chips using multiple testers.

* * * * *